US012622149B2

(12) United States Patent
Shin et al.

(10) Patent No.: US 12,622,149 B2
(45) Date of Patent: May 5, 2026

(54) DISPLAY DEVICE INCLUDING THICKNESS COMPENSATION PATTERN ON PIXEL ELECTRODE AND METHOD OF MANUFACTURING THE SAME

(71) Applicant: Samsung Display Co., LTD., Yongin-si (KR)

(72) Inventors: Hyuneok Shin, Yongin-si (KR); Joonyong Park, Yongin-si (KR); Juhyun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 379 days.

(21) Appl. No.: 18/314,192

(22) Filed: May 9, 2023

(65) Prior Publication Data

US 2024/0099091 A1     Mar. 21, 2024

(30) Foreign Application Priority Data

Sep. 16, 2022     (KR) ........................ 10-2022-0117090

(51) Int. Cl.
*H10K 59/35*          (2023.01)
*H10K 59/80*          (2023.01)
(Continued)

(52) U.S. Cl.
CPC ..... *H10K 59/353* (2023.02); *H10K 59/80517* (2023.02); *H10K 71/231* (2023.02);
(Continued)

(58) Field of Classification Search
None
See application file for complete search history.

(56) References Cited

U.S. PATENT DOCUMENTS

2011/0140114 A1*  6/2011  Ko ................... H10K 59/80518
                                                           438/23
2011/0229994 A1     9/2011  Jung
                  (Continued)

FOREIGN PATENT DOCUMENTS

CN        112259579         1/2021
KR        10-0787461       12/2007
                  (Continued)

OTHER PUBLICATIONS

Office Action dated Feb. 19, 2026 from the Korean Intellectual Property Office (KIPO) for Korean Patent Application No. 10-2022-0117090.

*Primary Examiner* — Daniel Whalen
(74) *Attorney, Agent, or Firm* — Sughrue Mion, PLLC

(57)          ABSTRACT

A display device includes a first sub-pixel area and a second sub-pixel area, a first pixel electrode in the first sub-pixel area and including a sequentially stacked a first conductive layer including a metal material and a second conductive layer including tungsten oxide, a second pixel electrode in the second sub-pixel area and including a third conductive layer, the third conductive layer and the first conductive layer including a same material and a fourth conductive layer, the fourth conductive layer and the second conductive layer including a same material, a thickness compensation pattern on the second pixel electrode and including a sequentially stacked first thickness compensation layer including a first transparent conductive oxide and a sequentially stacked second thickness compensation layer including a second transparent conductive oxide, a first light emitting layer on the first pixel electrode, and a second light emitting layer on the thickness compensation pattern.

19 Claims, 16 Drawing Sheets

(51) Int. Cl.
    *H10K 71/20*       (2023.01)
    *H10K 102/00*      (2023.01)
    *H10K 102/10*      (2023.01)

(52) U.S. Cl.
    CPC . *H10K 2102/102* (2023.02); *H10K 2102/103*
            (2023.02); *H10K 2102/351* (2023.02)

(56)           References Cited

U.S. PATENT DOCUMENTS

| | | | |
|---|---|---|---|
| 2014/0077185 A1 | 3/2014 | Lee et al. | |
| 2016/0093678 A1* | 3/2016 | Seo | H10K 59/80524 |
| | | | 257/89 |
| 2022/0352275 A1* | 11/2022 | Zhang | H10K 59/124 |
| 2023/0024131 A1* | 1/2023 | Shin | H10H 20/857 |

FOREIGN PATENT DOCUMENTS

| | | |
|---|---|---|
| KR | 10-2010-0062710 | 6/2010 |
| KR | 10-2011-0109049 A | 10/2011 |
| KR | 10-2014-0037678 A | 3/2014 |
| KR | 10-2014-0143631 | 12/2014 |
| KR | 10-2016-0093132 | 8/2016 |

\* cited by examiner

F I G . 7
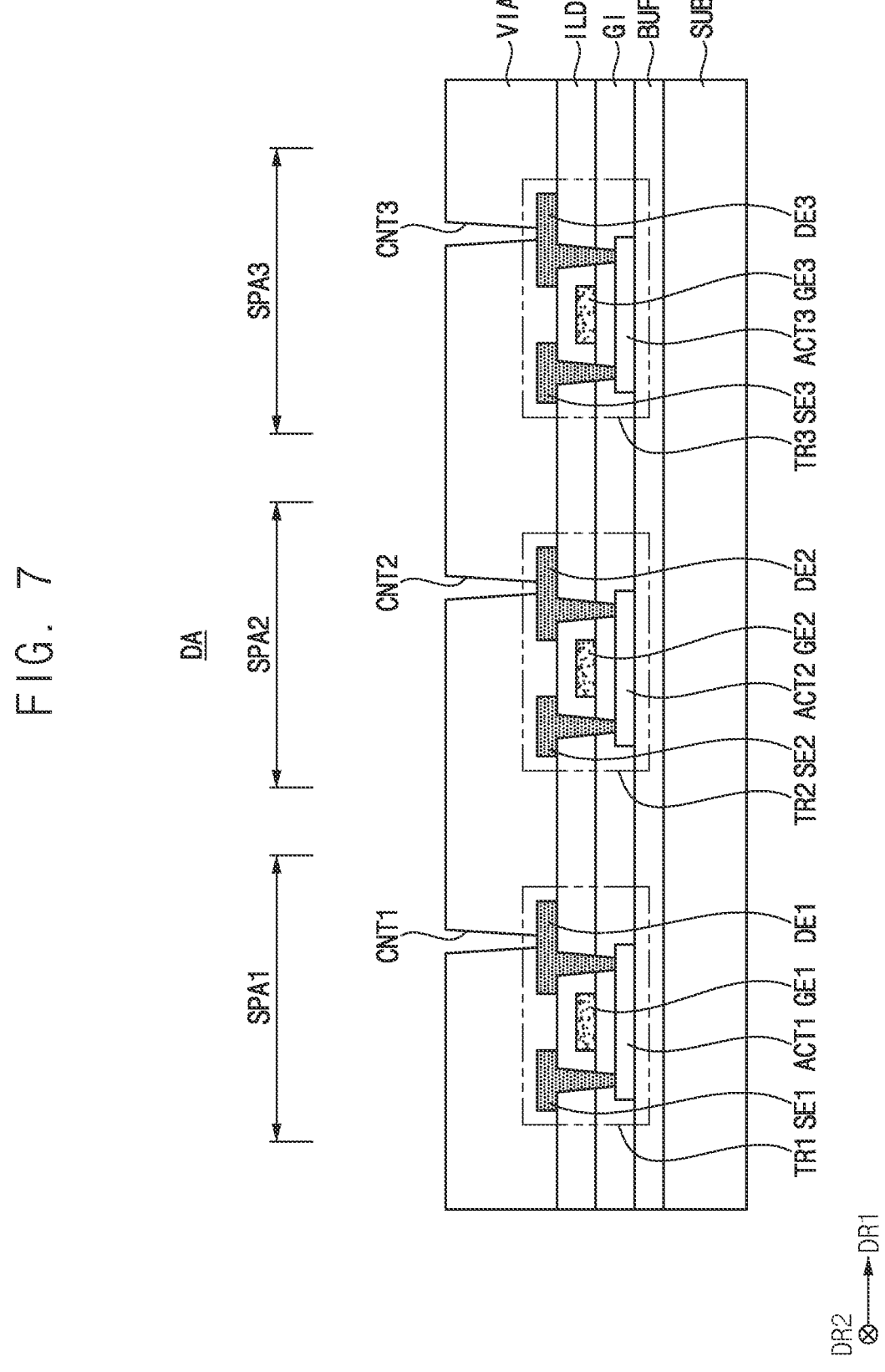

F I G . 11
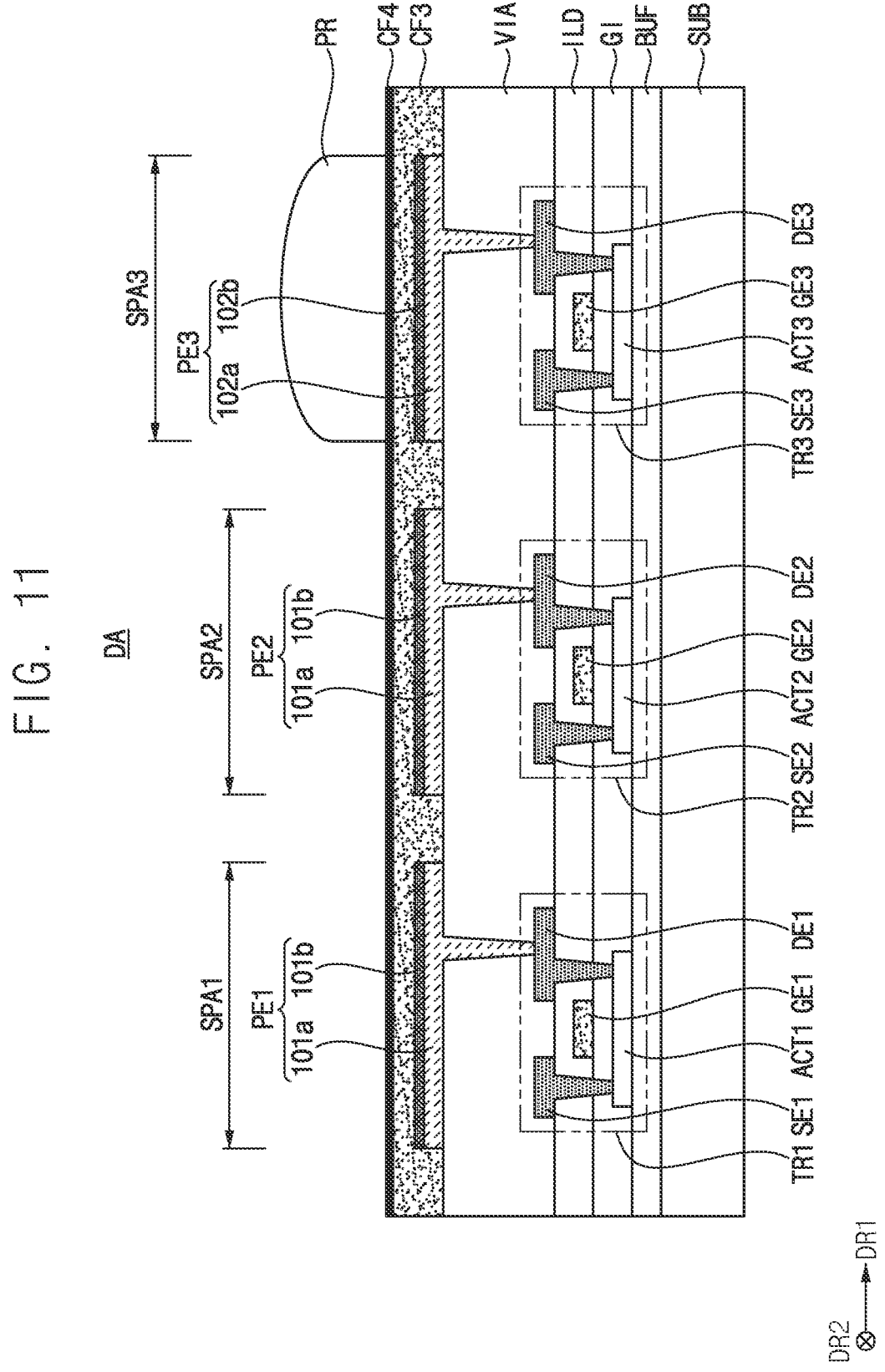

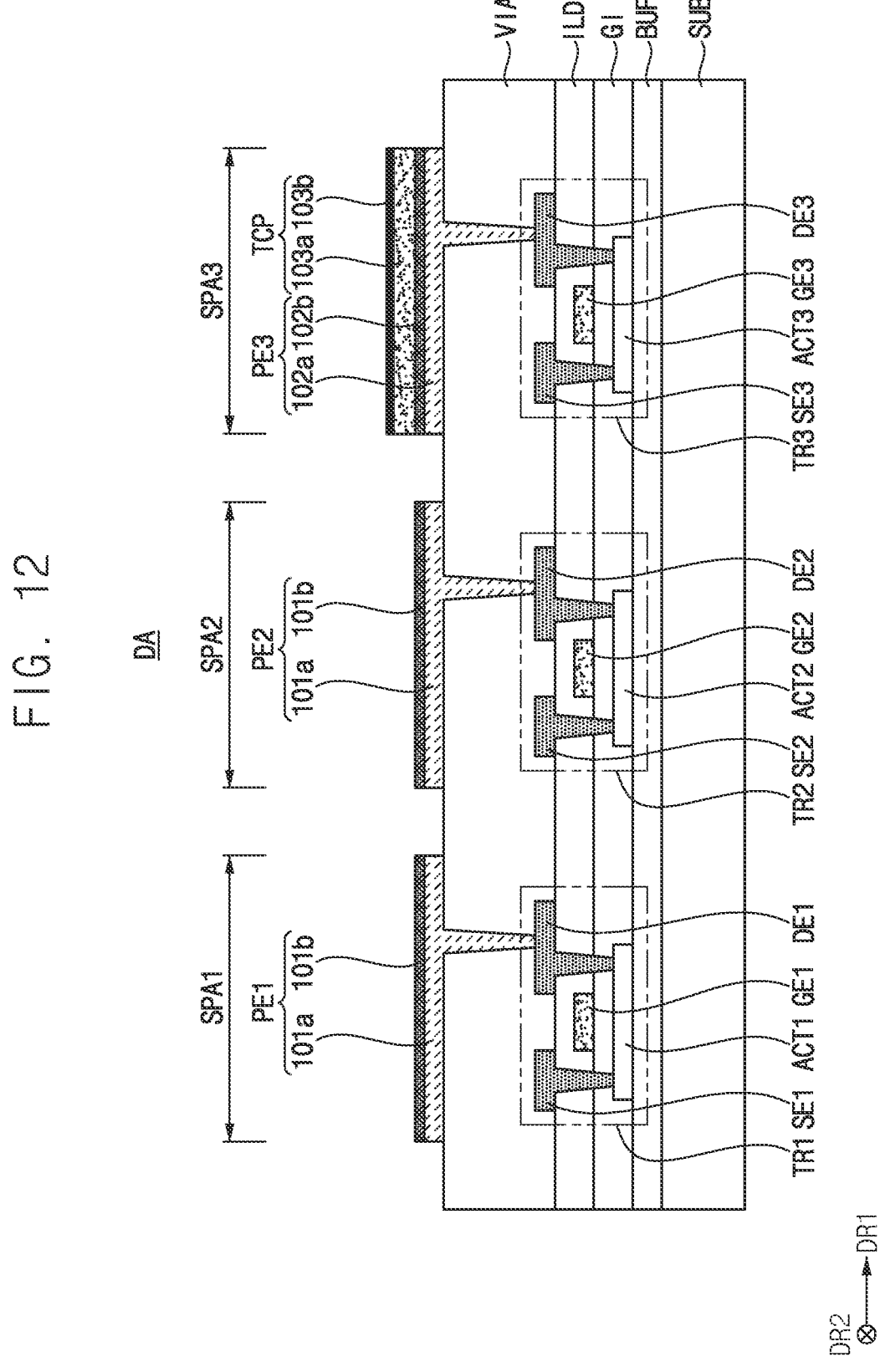
F I G . 12

F I G. 1 4
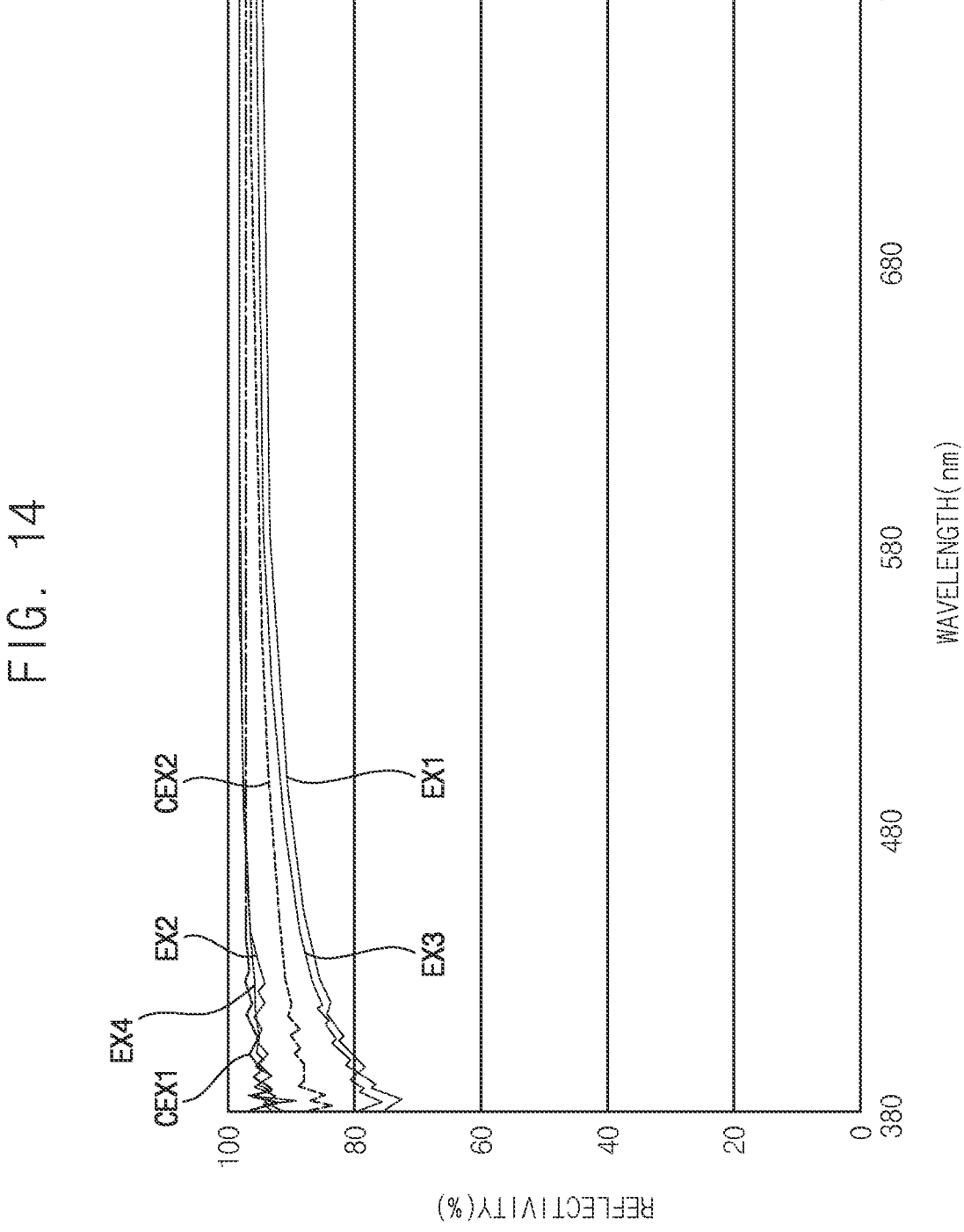

DISPLAY DEVICE INCLUDING THICKNESS COMPENSATION PATTERN ON PIXEL ELECTRODE AND METHOD OF MANUFACTURING THE SAME

CROSS-REFERENCE TO RELATED APPLICATION(S)

This application claims priority to and benefits of Korean Patent Application No. 10-2022-0117090 under 35 U.S.C. § 119, filed on Sep. 16, 2022 in the Korean Intellectual Property Office, the entire contents of which are incorporated herein by reference.

BACKGROUND

1. Technical Field

Embodiments generally relate to a display device. Embodiments relate to a display device and method of manufacturing the same.

2. Description of the Related Art

As information technology develops, the importance of display devices, which are communication media between users and information, is being highlighted. Accordingly, the use of display devices such as a liquid crystal display device, an organic light emitting display device, a plasma display device, and the like is increasing.

The display device may include light emitting elements, and the light emitting elements may include a pixel electrode, a common electrode, and a light emitting layer disposed between the pixel electrode and the common electrode. In order to improve power efficiency of the light emitting elements, functional layers (for example, a hole transport layer, an electron transport layer, an auxiliary layer, and the like) may be further disposed above and below the light emitting layer.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device capable of realizing a high resolution.

Embodiments provide a method of manufacturing the display device.

A display device may include a first sub-pixel area that emits a first light and a second sub-pixel area that emits a second light different from the first light; a first pixel electrode disposed in the first sub-pixel area on a substrate and including a sequentially stacked a first conductive layer including a metal material and a second conductive layer including tungsten oxide; a second pixel electrode disposed in the second sub-pixel area on the substrate and including a third conductive layer, the third conductive layer and the first conductive layer including a same material; and a fourth conductive layer, the fourth conductive layer and the second conductive layer including a same material; a thickness compensation pattern disposed on the second pixel electrode and including a sequentially stacked first thickness compensation layer including a first transparent conductive oxide and a sequentially stacked second thickness compensation layer including a second transparent conductive oxide; a first light emitting layer disposed on the first pixel electrode; and a second light emitting layer disposed on the thickness compensation pattern.

In an embodiment, the tungsten oxide included in the second conductive layer may further include tantalum.

In an embodiment, the metal material may include aluminum.

In an embodiment, a thickness of the first conductive layer may be substantially equal to a thickness of the third conductive layer, and a thickness of the second conductive layer may be substantially equal to a thickness of the fourth conductive layer.

In an embodiment, a thickness of the first conductive layer may be greater than a thickness of the second conductive layer and a thickness of the third conductive layer may be greater than a thickness of the fourth conductive layer.

In an embodiment, a thickness of the first thickness compensation layer may be less than a thickness of the third conductive layer.

In an embodiment, each of a thickness of the second conductive layer and a thickness of the fourth conductive layer may be greater than a thickness of the second thickness compensation layer.

In an embodiment, the first transparent conductive oxide may include at least one selected from a group consisting of indium zinc oxide and indium gallium zinc oxide, and the second transparent conductive oxide may include indium tin oxide.

In an embodiment, the thickness compensation pattern may have an etching rate higher than an etching rate of the first pixel electrode or the second pixel electrode with respect to a same etchant.

In an embodiment, the substrate may include a third sub-pixel area that emits a third light different from the first light of the first sub-pixel area and the second light of the second sub-pixel area.

In an embodiment, the display device may further include a third pixel electrode disposed in the third sub-pixel area; and a third light emitting layer disposed on the third pixel electrode. The first light emitting layer may overlap the first sub-pixel area in a plan view, the second light emitting layer may overlap the second sub-pixel area in a plan view, and the third light emitting layer may overlap the first sub-pixel area, the second sub-pixel area, and the third sub-pixel area in a plan view.

In an embodiment, the display device may further include a third pixel electrode disposed in the third-sub pixel area, the third pixel electrode and the first pixel electrode having a same structure.

In an embodiment, the display device may further include a third pixel electrode disposed in a third-sub pixel area, the third pixel electrode and the second pixel electrode having a same structure; and a first thickness compensation pattern disposed on the third pixel electrode, the first thickness compensation pattern and the thickness compensation pattern having a same structure.

A method of manufacturing a display device may include sequentially forming a first conductive film including a metal material and a second conductive film including tungsten oxide on a substrate including a first sub-pixel area that emits a first light and a second sub-pixel area that emits a second light different from the first light; forming a first conductive layer and a second conductive layer sequentially stacked in the first sub-pixel area and a third conductive layer and a fourth conductive layer sequentially stacked in the second sub-pixel area by etching the first conductive film and the second conductive film through dry etching; sequentially forming a third conductive film including a first transparent conductive oxide and a fourth conductive film including a second transparent conductive oxide on the substrate, the third conductive layer, and the fourth conductive layer; forming a first thickness compensation layer and a second thickness compensation layer sequentially stacked on the fourth conductive layer by etching the third conductive film and the fourth conductive film; forming a first light emitting layer on the second conductive layer; and forming a second light emitting layer on the fourth conductive layer.

In an embodiment, the forming of the first thickness compensation layer and the second thickness compensation layer may include forming a photosensitive organic layer on the third conductive layer and the fourth conductive layer; forming a photosensitive organic pattern overlapping the second sub-pixel area in a plan view by exposing the photosensitive organic layer; removing portions of the third conductive film and the fourth conductive film using the photosensitive organic pattern as a mask; and removing the photosensitive organic pattern.

In an embodiment, an upper surface of the photosensitive organic pattern may have a substantially convex shape in cross-section.

In an embodiment, in the removing of portions of the third conductive film and the fourth conductive film, the first thickness compensation layer and the second thickness compensation layer may be formed by remaining the third conductive film and the fourth conductive film overlapping the second sub-pixel area in a plan view.

In an embodiment, the forming the first thickness compensation layer and the second thickness compensation layer may be performed through wet etching or dry etching.

In an embodiment, the metal material may include aluminum.

In an embodiment, the first transparent conductive oxide may include at least one selected from a group consisting of indium zinc oxide and indium gallium zinc oxide, the second transparent conductive oxide may include indium tin oxide. A thickness of the third conductive layer may be greater than a thickness of the fourth conductive layer, a thickness of the first thickness compensation layer may be less than a thickness of the third conductive layer, and the thickness of the fourth conductive layer may be greater than a thickness of the second thickness compensation layer.

In a display device according to an embodiment, a first pixel electrode having a multi-layer structure including $Al/WO_x$ may be disposed in a first sub-pixel area that emits a first light, and a third pixel electrode having a multi-layer structure including $Al/WO_x$ may be disposed in a third sub-pixel area that emits a third light different from the first light. A thickness compensation pattern having a multi-layer structure including IZO (or IGZO)/ITO may be disposed on the third pixel electrode. Accordingly, the display device may realize high resolution (for example, the number of pixels per inch of the display device is about 2,000 (for example, about 2,000 ppi) or more).

In a method of manufacturing the display device according to an embodiment, a pixel electrode having a multi-layer structure including $Al/WO_x$ may be formed through a dry etching process. Accordingly, in the process of forming the pixel electrode, skew due to over-etching may be improved.

BRIEF DESCRIPTION OF THE DRAWINGS

Illustrative, non-limiting embodiments will be more clearly understood from the following detailed description in conjunction with the accompanying drawings in which:

FIGS. 6, 7, 8, 9, 10, 11, 12, and 13 are schematic cross-sectional views for a manufacturing method of the display device of FIG. 2.

FIG. 14 is a view illustrating reflectance of a pixel electrode according to a wavelength band of external light incident on a pixel electrode according to a comparative example and an example.

DETAILED DESCRIPTION OF THE EMBODIMENTS

Figure 1:
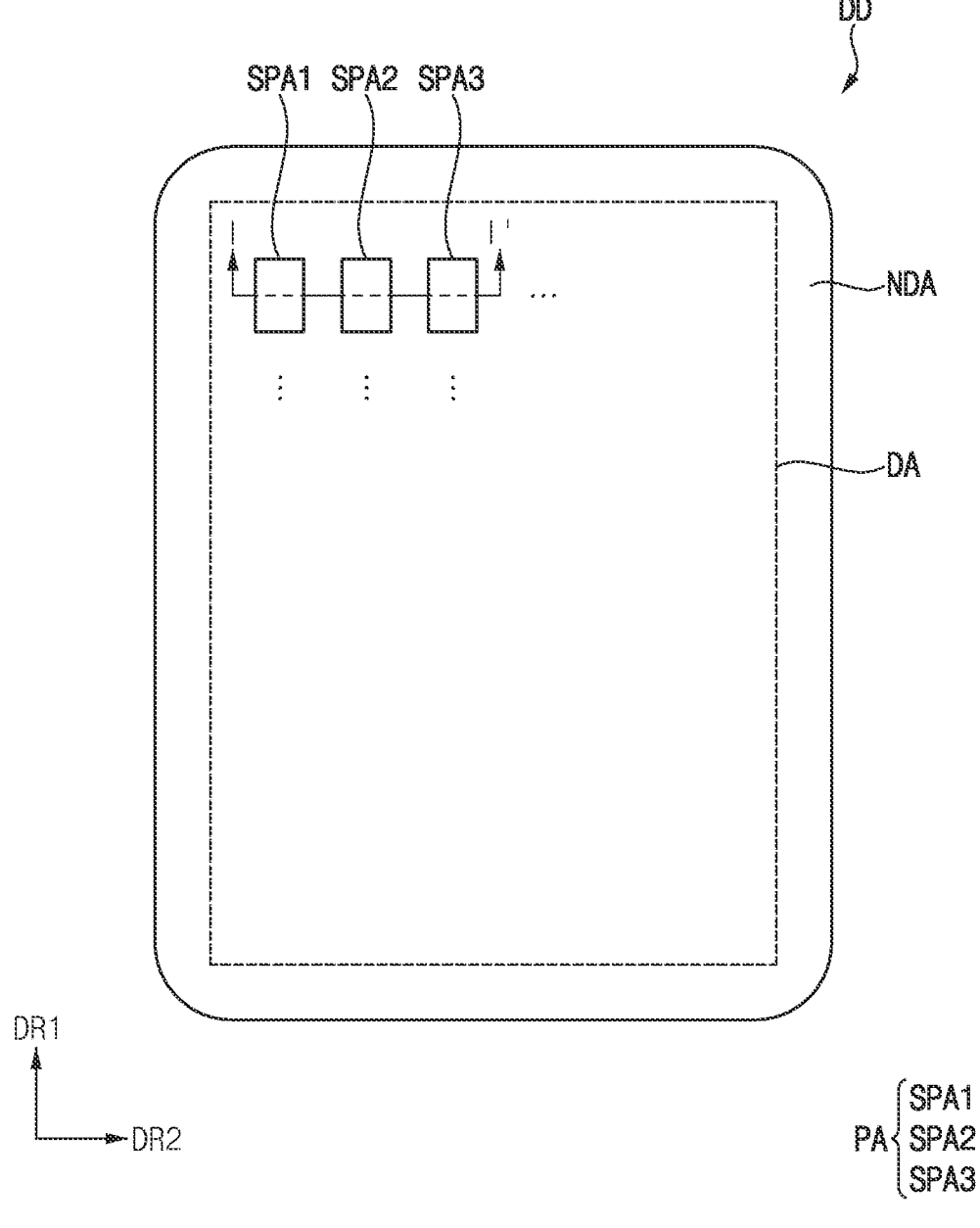
FIG. 1 is a schematic plan view schematically illustrating a display device according to an embodiment.

Hereinafter, a display device and a method of manufacturing the display device according to embodiments will be explained in detail with reference to the accompanying drawings. The same reference numerals are used for the same components in the drawings, and redundant descriptions of the same components may be omitted.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling. Embodiments may be described and illustrated in the accompanying drawings in terms of functional blocks, units, and/or modules.

Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies.

In the case of the blocks, units, and/or modules being implemented by microprocessors or other similar hardware, they may be programmed and controlled using software (for example, microcode) to perform various functions discussed herein and may optionally be driven by firmware and/or software.

It is also contemplated that each block, unit, and/or module may be implemented by dedicated hardware, or as a combination of dedicated hardware to perform some functions and a processor (for example, one or more programmed microprocessors and associated circuitry) to perform other functions.

Each block, unit, and/or module of embodiments may be physically separated into two or more interacting and discrete blocks, units, and/or modules without departing from the scope of the disclosure.

Further, the blocks, units, and/or modules of embodiments may be physically combined into more complex blocks, units, and/or modules without departing from the scope of the disclosure.

FIG. 1 is a schematic plan view schematically illustrating a display device according to an embodiment.

Referring to FIG. 1, a display device DD according to an embodiment may include a display area DA and a non-display area NDA. The display area DA may be an area capable of displaying an image by generating light or adjusting transmittance of light provided from an external light source. The non-display area PA may be an area that does not display an image. The non-display area NDA may be positioned around the display area DA. For example, the non-display area NDA may entirely surround the display area DA. The non-display area NDA may be adjacent to the display area DA.

The display device DD may have a rectangular planar shape with rounded corners.

However, the configuration of the disclosure is not limited thereto. For example, in a plan view, the display device DD may have various shapes (for example, a rectangular planar shape with vertical corners). It is to be understood that the shapes disclosed herein may also include shapes substantial to the shapes disclosed herein.

The display area DA may include pixel areas PA. A pixel may be disposed in each of the pixel areas PA. As the pixels emit light, the display area DA may display an image.

Each of the pixel areas PA may include a first sub-pixel area SPA1, a second sub-pixel area SPA2, and a third sub-pixel area SPA3. Each of the first sub-pixel area SPA1, the second sub-pixel area SPA2, and the third sub-pixel area SPA3 may be an area where light emitted from the light emitting element is emitted to the outside of the display device DD.

The first sub-pixel area SPA1, the second sub-pixel area SPA2, and the third sub-pixel area SPA3 may emit light of different colors. For example, the first sub-pixel area SPA1 emits first light, the second sub-pixel area SPA2 may emit second light, and the third sub-pixel area SPA3 may emit third light. In an embodiment, the first light may be red light, the second light may be green light, and the third light may be blue light. However, the configuration of the disclosure is not limited thereto. For example, the first sub-pixel area SPA1, the second sub-pixel area SPA2, and the third sub-pixel area SPA3 may be combined to emit yellow, cyan, and magenta lights.

The first sub-pixel area SPA1, the second sub-pixel area SPA2, and the third sub-pixel area SPA3 may emit light of four or more colors. For example, the first sub-pixel area SPA1, the second sub-pixel area SPA2, and the third sub-pixel area SPA3 may be combined to further emit at least one of yellow, cyan, and magenta lights in addition to red, green, and blue lights. The first sub-pixel area SPA1, the second sub-pixel area SPA2, and the third sub-pixel area SPA3 may be combined to further emit white light.

Each of the first sub-pixel area SPA1, the second sub-pixel area SPA2, and the third sub-pixel area SPA3 may have a triangular planar shape, a quadrangular planar shape, a circular planar shape, a track-shaped planar shape, an elliptical planar shape, or the like within the spirit and the scope of the disclosure. In an embodiment, each of the first sub-pixel area SPA1, the second sub-pixel area SPA2, and the third sub-pixel area SPA3 may have a rectangular planar shape.

In a plan view, the first sub-pixel area SPA1, the second sub-pixel area SPA2, and the third sub-pixel area SPA3 may be repeatedly arranged or disposed along a row direction and a column direction. For example, the first sub-pixel area SPA1, the second sub-pixel area SPA2, and the third sub-pixel area SPA3 may be arranged or disposed repeatedly in a first direction DR1 and a second direction intersecting the first direction DR2.

In this specification, a plane may be defined as the first direction DR1 and the second direction DR2 intersecting the first direction DR1. For example, the second direction DR2 may be perpendicular to the first direction DR1.

Figure 2:
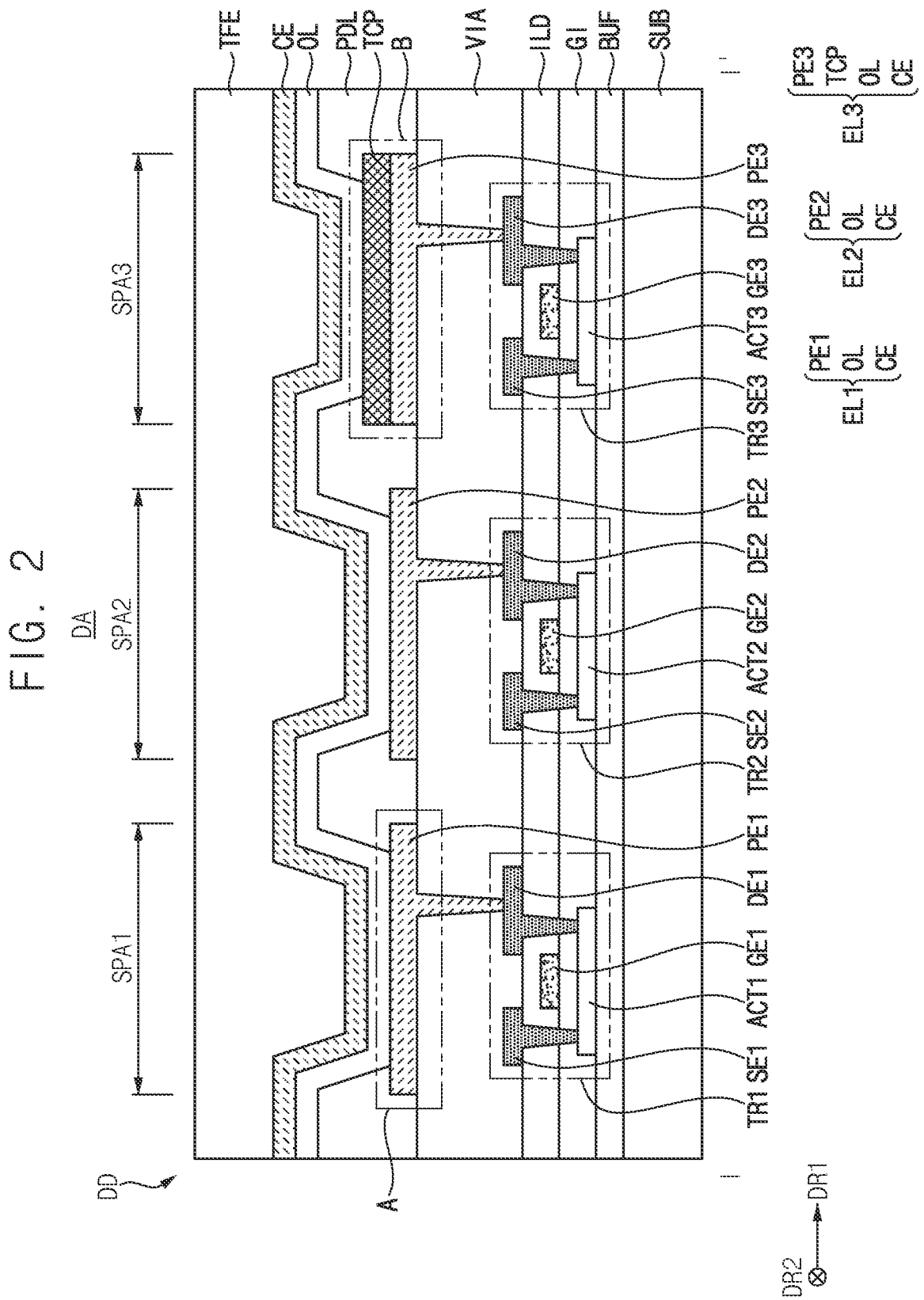
FIG. 2 is a schematic cross-sectional view taken along line I-I' of FIG. 1.
Figure 3:
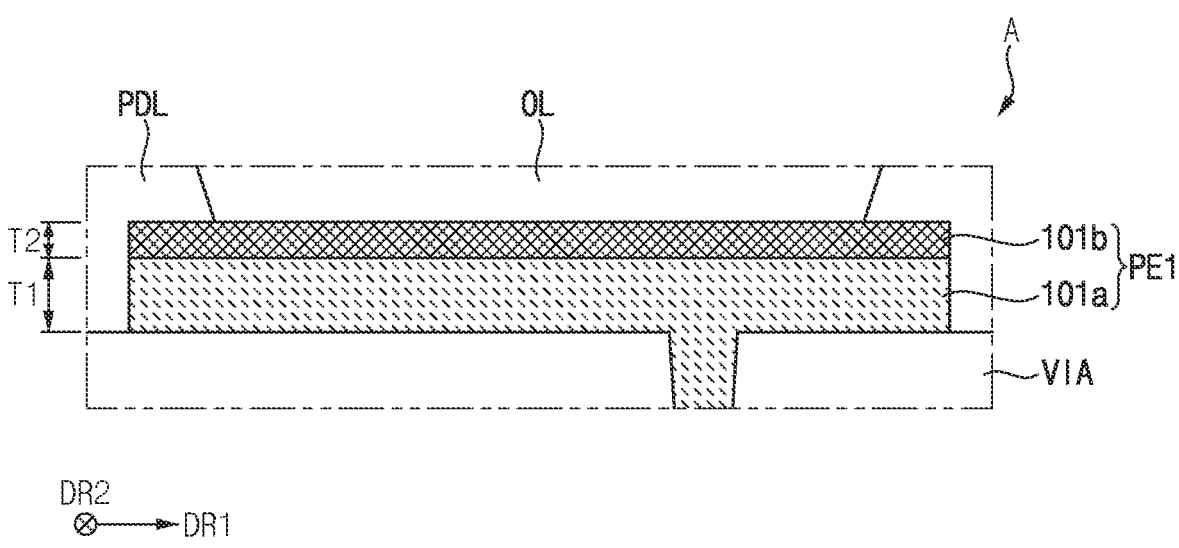
FIG. 3 is an enlarged schematic cross-sectional view of area A of FIG. 2.
Figure 4:
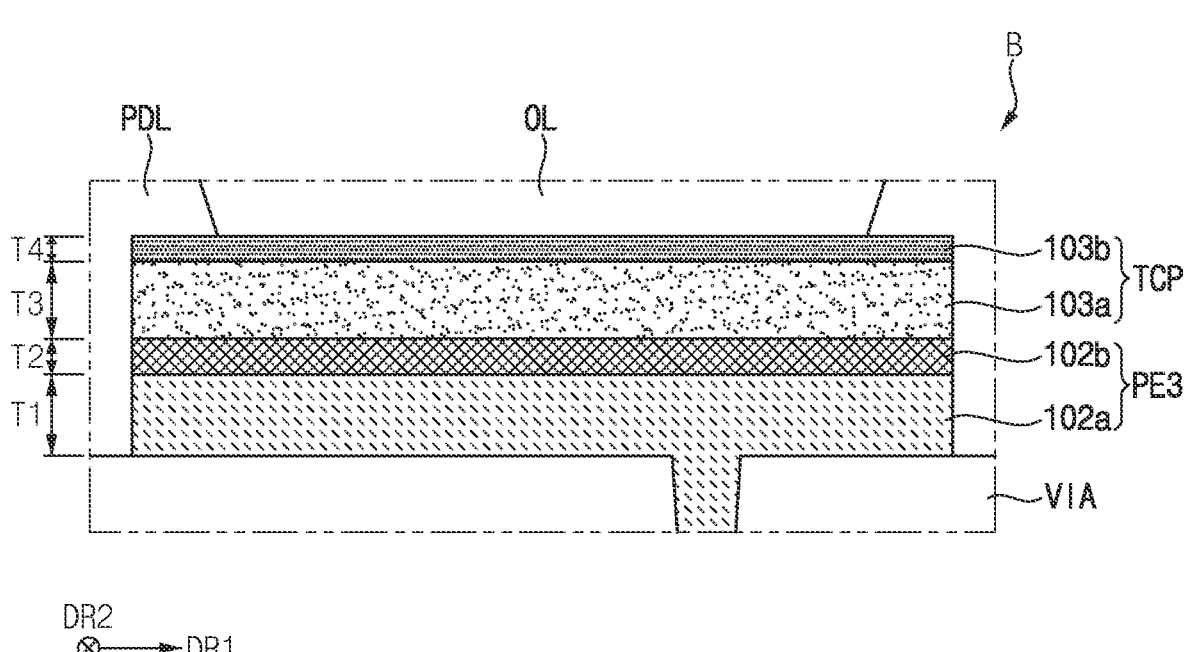
FIG. 4 is an enlarged schematic cross-sectional view of area B of FIG. 2.

FIG. 2 is a schematic cross-sectional view taken along line I-I' of FIG. 1. FIG. 3 is an enlarged schematic cross-sectional view of area A of FIG. 2. FIG. 4 is an enlarged schematic cross-sectional view of area B of FIG. 2.

Referring to FIGS. 2, 3, and 4, the display device DD according to an embodiment may include a substrate SUB, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements EL1, EL2, and EL3, and an encapsulation layer TFE.

Here, the first transistor TR1 may include a first active pattern ACT1, a first gate electrode GE1, a first source electrode SE1, and a first drain electrode DE1. The second transistor TR2 may include a second active pattern ACT2, a second gate electrode GE2, a second source electrode SE2, and a second drain electrode DE2. The third transistor TR3 may include a third active pattern ACT3, a third gate electrode GE3, a third source electrode SE3, and a third drain electrode DE3.

The first light emitting element EL1 may include a first pixel electrode PE1, an organic layer OL, and a common electrode CE. The second light emitting element EL2 may include a second pixel electrode PE2, an organic layer OL, and the common electrode CE. The third light emitting element EL3 may include a third pixel electrode PE3, a thickness compensation pattern TCP, the organic layer OL, and the common electrode CE.

The substrate SUB may include a transparent material or an opaque material. The substrate SUB may be made of a transparent resin substrate. Examples of the transparent resin substrate may include polyimide substrates and the like within the spirit and the scope of the disclosure. The polyimide substrate may include a first organic layer, a first barrier layer, and a second organic layer. By way of example, the substrate SUB may include a quartz substrate, a synthetic quartz substrate, a calcium fluoride substrate, an F-doped quartz substrate, a soda-lime glass substrate, a non-alkali glass substrate, and the like within the spirit and the scope of the disclosure. These may be used alone or in combination with each other.

The buffer layer BUF may be disposed on the substrate SUB. The buffer layer BUF may prevent diffusion of metal atoms or impurities from the substrate SUB into the first, second, and third transistors TR1, TR2, and TR3. The buffer layer BUF may improve flatness of the surface of the substrate SUB in case that the surface of the substrate SUB is not uniform. For example, the buffer layer BUF may include an inorganic material such as silicon oxide, silicon nitride, silicon oxynitride, and the like within the spirit and the scope of the disclosure. These may be used alone or in combination with each other.

The first, second, and third active patterns ACT1, ACT2, and ACT3 may be disposed on the buffer layer BUF. Each of the first, second, and third active patterns ACT1, ACT2, and ACT3 may include a metal oxide semiconductor, an inorganic semiconductor (for example, amorphous silicon, poly silicon), or an organic semiconductor. The first, second, and third active patterns ACT1, ACT2, and ACT3 may include a same material or a similar material. For example, each of the first, second, and third active patterns ACT1, ACT2, and ACT3 may include a source region, a drain region, and a channel region positioned between the source region and the drain region.

The metal oxide semiconductor may include a two-component compound ("$AB_x$"), a ternary compound ("$AB_xC_y$"), a four-component compound ("$ABXC_yD_z$"), and the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), and the like within the spirit and the scope of the disclosure. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), indium tin oxide ("ITO"), indium zinc tin oxide ("IZTO"), indium gallium zinc oxide ("IGZO"), and the like within the spirit and the scope of the disclosure. These may be used alone or in combination with each other.

The gate insulating layer GI may be disposed on the buffer layer BUF. The gate insulating layer GI may cover the first, second, and third active patterns ACT1, ACT2, and ACT3. For example, the gate insulating layer GI may sufficiently cover the first, second, and third active patterns ACT1, ACT2, and ACT3, and may have a substantially flat upper surface without creating a step around the first, second, and third active patterns ACT1, ACT2, and ACT3. By way of example, the gate insulating layer GI may cover the first, second, and third active patterns ACT1, ACT2, and ACT3, and may be along the profiles of the first, second, and third active patterns ACT1, ACT2, and ACT3 with a uniform thickness.

For example, the gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), and the like within the spirit and the scope of the disclosure. These may be used alone or in combination with each other.

The first, second, and third gate electrodes GE1, GE2, and GE3 may be disposed on the gate insulating layer GI. The first gate electrode GE1 may overlap the channel region of the first active pattern ACT1, the second gate electrode GE2 may overlap the channel region of the second active pattern ACT2, and the third gate electrode GE3 may overlap the channel region of the third active pattern ACT2.

For example, each of the first, second, and third gate electrodes GE1, GE2, and GE3 may include a metal, an alloy, a metal nitride, a conductive metal oxide, a transparent conductive material, and the like within the spirit and the scope of the disclosure. These may be used alone or in combination with each other. The first, second, and third gate electrodes GE1, GE2, and GE3 may include a same material or a similar material.

The interlayer insulating layer ILD may be disposed on the buffer layer BUF. The interlayer insulating layer ILD may cover the first, second, and third gate electrodes GE1, GE2, and GE3. For example, the interlayer insulating layer ILD may sufficiently cover the first, second, and third gate electrodes GE1, GE2, and GE3, and may have a substantially flat upper surface without creating a step around the first, second, and third gate electrodes GE1, GE2, and GE. By way of example, the interlayer insulating layer ILD may cover the first, second, and third gate electrodes GE1, GE2, and GE3 and may be along the profiles of the first, second, and third gate electrodes GE1, GE2, and GE3 with a uniform thickness.

For example, the interlayer insulating layer ILD may include an inorganic material such as silicon oxide, silicon nitride, silicon carbide, silicon oxynitride, silicon oxycarbide, and the like within the spirit and the scope of the disclosure. These may be used alone or in combination with each other.

The first, second, and third source electrodes SE1, SE2, and SE3 may be disposed on the interlayer insulating layer ILD. The first source electrode SE1 may be connected to the source region of the first active pattern ACT1 through a contact hole penetrating a first portion of the gate insulating layer GI and the interlayer insulating layer ILD. The second source electrode SE2 may be connected to the source region of the second active pattern ACT2 through a contact hole penetrating a second portion of the gate insulating layer GI and the interlayer insulating layer ILD. The third source electrode SE3 may be connected to the source region of the third active pattern ACT3 through a contact hole penetrating a third portion of the gate insulating layer GI and the interlayer insulating layer ILD.

The first, second, and third drain electrodes DE1, DE2, and DE3 may be disposed on the interlayer insulating layer ILD. The first drain electrode DE1 may be connected to the drain region of the first active layer ACT1 through a contact hole penetrating a fourth portion of the gate insulating layer GI and the interlayer insulating layer ILD. The second drain electrode DE2 may be connected to the drain region of the second active layer ACT2 through a contact hole penetrating a fifth portion of the gate insulating layer GI and the interlayer insulating layer ILD. The third drain electrode DE3 may be connected to the drain region of the third active layer ACT3 through a contact hole penetrating a sixth portion of the gate insulating layer GI and the interlayer insulating layer ILD.

For example, each of the first, second, and third source electrodes SE1, SE2, and SE3 and the first, second, and third drain electrodes DE1, DE2, and DE3 may be a metal, an alloy, a metal nitride, a conductive metal oxide, a transparent conductive material, and the like within the spirit and the scope of the disclosure. These may be used alone or in combination with each other. The first, second, and third drain electrodes DE1, DE2, and DE3 may include a same material or a similar material as the first, second, and third source electrodes SE1, SE2, and SE3.

Accordingly, the first transistor TR1 including the first active layer ACT1, the first gate electrode GE1, the first source electrode SE1 and the first drain electrode DE1 may be disposed on the substrate SUB. The second transistor TR2 including the second active layer ACT2, the second gate electrode GE2, the second source electrode SE2, and the second drain electrode DE2 may be disposed on the substrate SUB. The third transistor TR3 including the third active layer ACT3, the third gate electrode GE3, the third source electrode SE3, and the third drain electrode DE3 may be disposed on the substrate SUB.

The via insulating layer VIA may be disposed on the interlayer insulating layer ILD. The via insulating layer VIA may sufficiently cover the first, second, and third source electrodes SE1, SE2, and SE3 and the first, second, and third drain electrodes DE1, DE2, and DE3. The via insulating layer VIA may include an inorganic material or an organic material. In an embodiment, the via insulating layer VIA may include an organic material. For example, the via insulating layer VIA may be made of phenolic resin, polyacrylates resin, polyimides rein, polyamides resin, siloxane resin, epoxy resin, and the like within the spirit and the scope of the disclosure. These may be used alone or in combination with each other.

The first, second, and third pixel electrodes PE1, PE2, and PE3 may be disposed on the via insulating layer VIA. The first pixel electrode PE1 may overlap the first sub-pixel area SPA1, the second pixel electrode PE2 may overlap the second sub-pixel area SPA2, and the third pixel electrode PE3 may overlap the third sub-pixel area SPA3.

Each of the first, second, and third pixel electrodes PE1, PE2, and PE3 may have a multi-layer structure. In an embodiment, each of the first, second, and third pixel electrodes PE1, PE2, and PE3 may have a two-layer structure. However, the configuration of the disclosure is not limited thereto. Each of the first, second, and third pixel electrodes PE1, PE2, and PE3 may have a structure of three or more layers.

In an embodiment, the first pixel electrode PE1 may include a first conductive layer 101a and a second conductive layer 101b sequentially stacked each other on the via insulating layer VIA, and the third pixel electrode PE3 may include a third conductive layer 102a and a fourth conductive layer 102b sequentially stacked each other on the via insulating layer VIA. The second pixel electrode PE2 may have a same structure as the first pixel electrode PE1. For example, the second pixel electrode PE2 may have a structure in which two conductive layers including a same material or a similar material as the first conductive layer 101a and the second conductive layer 101b of the first pixel electrode PE1 may be stacked each other. Therefore, a description of the stacked structure of the second pixel electrode PE2 may be omitted.

The first conductive layer 101a may include metal or alloy. For example, the first conductive layer 101a may include silver ("Ag"), an alloy containing silver, aluminum ("Al"), an alloy containing aluminum, molybdenum ("Mo"), an alloy containing molybdenum, tungsten ("W"), nickel ("Ni"), chromium ("Cr"), titanium ("Ti"), tantalum ("Ta"), copper ("Cu"), platinum ("Pt"), scandium ("Sc"), and the like within the spirit and the scope of the disclosure. These may be used alone or in combination with each other. In an embodiment, the first conductive layer 101a may include aluminum.

The second conductive layer 101b may include a conductive metal oxide having a relatively high work function. In an embodiment, the second conductive layer 101b may include tungsten oxide ("WO$_x$"). For example, the work function of the tungsten oxide may be in a range of about 5.2 eV to about 5.6 eV.

In an embodiment, the tungsten oxide included in the second conductive layer 101b may further contain tantalum. For example, in case that the tungsten oxide included in the second conductive layer 101b further includes tantalum, a content of the tantalum may be about 10 at %. Accordingly, in the process of forming the second conductive layer 101b, the second conductive layer 101b including tungsten oxide containing tantalum may be prevented from being dissolved in water, a developing solution (for example, tetramethyl-ammonium hydroxide ("TMAH")), and the like within the spirit and the scope of the disclosure.

The third conductive layer 102a may include a same material or a similar material as the first conductive layer 101a. For example, the third conductive layer 102a may be disposed on a same layer as the first conductive layer 101a. The fourth conductive layer 102b may include a same material or a similar material as the second conductive layer 101b. For example, the fourth conductive layer 102b may be disposed on a same layer as the second conductive layer 101b.

The thickness compensation pattern TCP may be disposed on the third pixel electrode PE3. A resonance thickness of light emitted from the organic layer OL may be controlled by the thickness compensation pattern TCP. In an embodiment, the thickness compensation pattern TCP may include a first thickness compensation layer 103a and a second thickness compensation layer 103b sequentially stacked each other.

The thickness compensation pattern TCP may have an etching rate different from an etching rate of the pixel electrodes PE1, PE2, and PE3 with respect to a same etchant. In an embodiment, the thickness compensation pattern TCP may have a higher etching rate than the pixel electrodes PE1, PE2, and PE3 with respect to a same etchant. The thickness compensation pattern TCP and the pixel electrodes PE1, PE2, and PE3 as illustrated in FIG. 2 may be formed by a difference in etching rate between the thickness compensation pattern TCP and the pixel electrodes PE1, PE2, and PE3.

The first thickness compensation layer 103a may include a first transparent conductive oxide. In an embodiment, the first transparent conductive oxide may include indium zinc oxide ("IZO"), indium gallium zinc oxide ("IGZO"), and the like within the spirit and the scope of the disclosure. These may be used alone or in combination with each other. However, the disclosure is not limited thereto, and the first thickness compensation layer 103a may include various transparent conductive oxides.

The second thickness compensation layer 103b may include a second transparent conductive oxide different from the first transparent conductive oxide. In an embodiment, the second thickness compensation layer 103b may include indium tin oxide ("ITO"). However, the disclosure is not limited thereto, and the second thickness compensation layer 103b may include various transparent conductive oxides.

A thickness T1 of the first conductive layer 101a may be different from a thickness T2 of the second conductive layer 101b. In an embodiment, the thickness T1 of the first conductive layer 101a may be greater than the thickness T2 of the second conductive layer 102b. For example, the thickness T1 of the first conductive layer 101a may be in a range of about 950 Å to about 1050 Å, and the thickness T2 of the second conductive layer 101b may be in a range of about 100 Å to about 200 Å. The thickness T1 of the first conductive layer 101a may be about 1000 Å, and the thickness T2 of the second conductive layer 101b may be about 150 Å. The thickness T1 of the third conductive layer 102a may be equal to the thickness T1 of the first conductive layer 101a, and the thickness T2 of the fourth conductive layer 102b may be equal to the thickness T2 of the second conductive layer 101b.

A thickness T3 of the first thickness compensation layer 103a may be different from the thickness T1 of the third conductive layer 102a. In an embodiment, the thickness T3 of the first thickness compensation layer 103a may be smaller than the thickness T1 of the third conductive layer 102a. The thickness T4 of the second thickness compensation layer 103b may be different from the thickness T2 of the fourth conductive layer 102b. In an embodiment, the thickness T4 of the second thickness compensation layer 103b may be smaller than the thickness T2 of the fourth conductive layer 102b. For example, the thickness T3 of the first thickness compensation layer 103a may be in a range of about 750 Å to about 850 Å, and the thickness T4 of the second thickness compensation layer 103b may be in a range of about 20 Å to about 120 Å. The thickness T3 of the first thickness compensation layer 103a may be about 800 Å, and the thickness T4 of the second thickness compensation layer 103b may be about 70 Å.

Here, each of the first pixel electrode PE1 and the second pixel electrode PE2 may be defined as a first anode electrode. The third pixel electrode PE3 and the thickness compensation pattern TCP may be collectively defined as a second anode electrode.

In case that the thickness compensation pattern TCP does not include IZO (or IGZO) but only ITO, residues may remain on the thickness compensation pattern TCP due to over-etching in the process of forming the thickness compensation pattern TCP. Water may remain. Therefore, in case that the thickness compensation pattern TCP includes sequentially stacked IZO (or IGZO) and ITO, residues remaining on the thickness compensation pattern TCP may be minimized.

Accordingly, the first light emitting element EL1 including the first pixel electrode PE1, the organic layer OL, and the common electrode CE may be disposed in the first sub-pixel area SPA1 on the substrate SUB, the second light emitting element EL2 including the second pixel electrode PE2, the organic layer OL, and the common electrode CE may be disposed in the second sub-pixel area SPA2 on the substrate SUB, and the third light emitting element EL3 including the third pixel electrode PE3, the thickness compensation pattern TCP, the organic layer OL, and the common electrode CE may be disposed in the third sub-pixel area SPA3 on the substrate SUB.

The pixel defining layer PDL may be disposed on the via insulating layer VIA. The pixel defining layer PDL may expose a portion of an upper surface of each of the first pixel electrode PE1, the second pixel electrode PE2, and the thickness compensation pattern TCP. The pixel defining layer PDL may include an inorganic material or an organic material. In an embodiment, the pixel defining layer PDL may include an organic material. For example, the pixel defining layer 170 may include an organic material such as polyimide.

In an embodiment, the pixel defining layer PDL may further include a black light blocking material. For example, the pixel defining layer PDL may further include a light blocking material such as black pigment, black dye, carbon black, and the like within the spirit and the scope of the disclosure. These may be used alone or in combination with each other.

The organic layer OL may be disposed on the pixel defining layer PDL, the first pixel electrode PE1, the second pixel electrode PE2, and the third pixel electrode PE3. The organic layer OL may include an electron transport layer, an electron injection layer, a light emitting layer, a hole transport layer, a hole injection layer, and the like within the spirit and the scope of the disclosure. For example, the organic layer OL may continuously extend over the display area DA. Some elements (for example, the first and third light emitting layers EML1 and EML3 of FIG. 5) included in the organic layer OL may be disposed in each of the first and third sub-pixel areas SPA1 and SPA3. A detailed description of the organic layer OL will be described later.

A thickness of the organic layer OL may be determined according to a resonance thickness of light emitted from each of the sub-pixel areas SPA1, SPA2, and SPA3. The resonance thickness may represent a thickness at which light resonance occurs. For example, light generated in the organic layer OL may resonate between the pixel electrodes PE1, PE2, and PE3 and the common electrode CE.

The resonance thickness may vary according to the wavelength of light. Accordingly, in case that the distance between the pixel electrode and the common electrode CE in each sub-pixel areas SPA1, SPA2, and SPA3 is equal to or close to the resonance thickness of light emitted from each sub-pixel areas SPA1, SPA2, and SPA3, light of a specific or given wavelength may emitted or light intensity may be increased.

For example, in case that the thickness compensation pattern TCP is not disposed on the third pixel electrode PE3 in the third sub-pixel area SPA3, the distance between the third pixel electrode PE3 and the common electrode CE may be different from the resonance thickness of light emitted from the third sub-pixel area SPA3. However, in case that the thickness compensation pattern TCP is disposed on the third pixel electrode PE3 in the third sub-pixel area SPA3, due to the thickness compensation pattern TCP disposed on the third pixel electrode PE3, a distance between the third pixel electrode PE3 and the common electrode CE may have a value corresponding to the resonance thickness of the light.

The common electrode CE may be disposed on the organic layer OL. The common electrode CE may continuously extend throughout the display area DA. For example, the common electrode CE may include a metal, an alloy, a metal nitride, a conductive metal oxide, a transparent conductive material, and the like within the spirit and the scope of the disclosure. These may be used alone or in combination with each other. For example, the common electrode CE may operate as a cathode.

The encapsulation layer TFE may be disposed on the common electrode CE. The encapsulation layer TFE may prevent impurities, moisture, and the like from permeating the first, second, and third light emitting elements EL1, EL2, and EL3 from the outside. The encapsulation layer TFE may include at least one inorganic encapsulation layer and at least one organic encapsulation layer. For example, the inorganic encapsulation layer may include silicon oxide, silicon nitride, silicon oxynitride, and the like within the spirit and the scope of the disclosure. These may be used alone or in combination with each other. The organic encapsulation layer may include a polymer cured material such as polyacrylate.

The display device DD may include an organic light emitting display device ("OLED"), a liquid crystal display device ("LCD"), a field emission display device ("FED"), plasma display device ("PDP"), an electrophoretic display device ("EPD"), a quantum dot display device, or an inorganic light emitting display device.

In the display device DD according to an embodiment, the first pixel electrode PE1 having a multi-layer structure including Al/WO$_x$ may be disposed in the first sub-pixel area SPA1 emitting the first light, and the third pixel electrode PE3 having a multi-layer structure including Al/WO$_x$ may be disposed in the third sub-pixel area SPA3 emitting a third light different from the first light. The thickness compensation pattern TCP having a multi-layer structure including IZO (or IGZO)/ITO may be disposed on the third pixel electrode PE3. Accordingly, the manufacturing process of the display device DD may be simplified. For example, due to the thickness compensation pattern TCP disposed on the third pixel electrode PE3, an organic thickness compensation pattern formed through a fine metal mask ("FMM") process may be omitted. The display device DD may implement high resolution (for example, the number of pixels per inch of the display device DD is about 2,000 (for example, about 2,000 ppi) or more).

Figure 5:
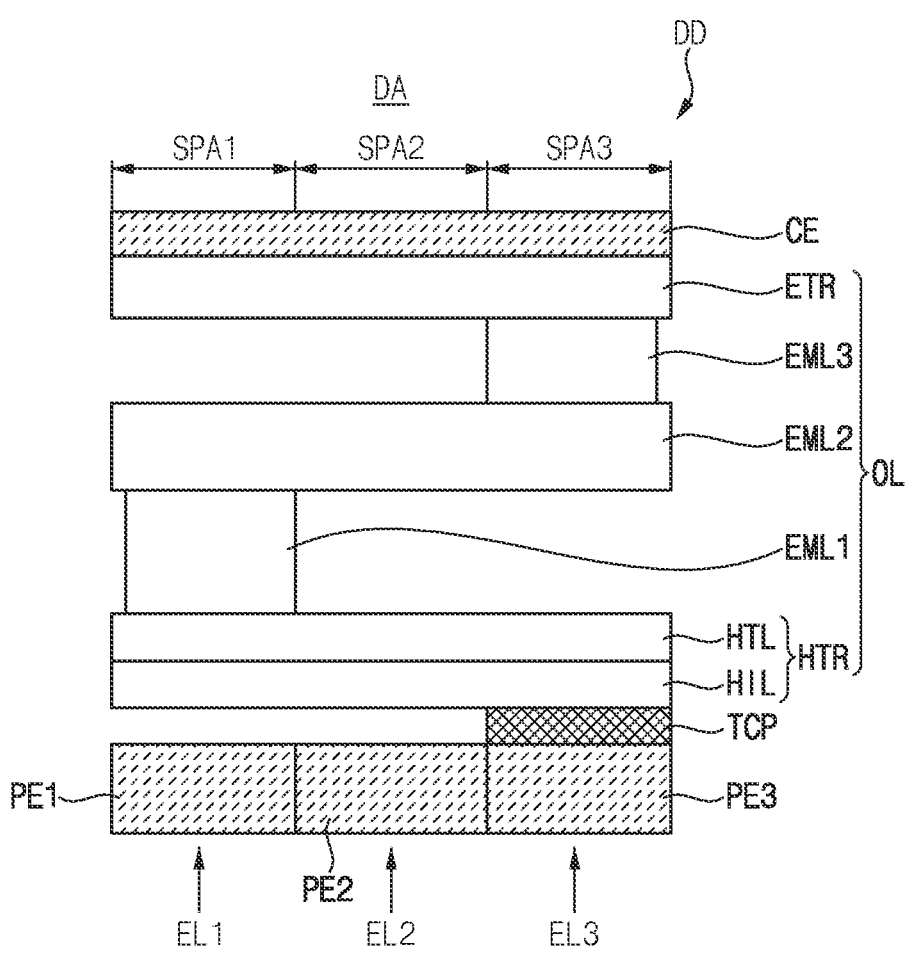
FIG. 5 is a schematic cross-sectional view schematically illustrating the display device of FIG. 2.

FIG. 5 is a schematic cross-sectional view schematically illustrating the display device of FIG. 2.

Referring to FIGS. 2 and 5, the display device DD according to an embodiment may include the first light emitting element EL1, the second light emitting element EL2, and the third light emitting element EL3. As described above, the first light emitting element EL1 may include the first pixel electrode PE1, the organic layer OL, and the common electrode CE, the second light emitting element EL2 may include the second pixel electrode PE2, the organic layer OL, and the common electrode CE, and the third light emitting element EL3 may include the third pixel electrode PE3, the organic layer OL, and the common electrode CE.

The organic layer OL may include a light emitting layer generating light according to an applied current. For example, the organic layer OL may include a hole transport region ETR, a first light emitting layer EML1, a second light emitting layer EML2, a third light emitting layer EML3, and an electron transport region HTR. The first light emitting layer EML1 may be included in the first light emitting element EL1, the second light emitting layer EML2 may be included in the second light emitting element EL2, and the third light emitting layer EML3 may be included in the third light emitting element EL3.

The hole transport region ETR may be disposed on the first, second, and third pixel electrodes PE1, PE2, and PE3 and the thickness compensation pattern TCP, and may overlap the first, second, and third sub-pixel areas SPA1, SPA2, and SPA3. The hole transport region ETR may include a hole injection layer HIL and a hole transport layer HTL. By way of example, the hole transport region ETR may further include a hole buffer layer, an electron blocking layer, and the like within the spirit and the scope of the disclosure.

The first light emitting layer EML1 may be disposed on the hole transport region ETR and may overlap the first sub-pixel area SPA1. In case that electrons and holes are injected into the first light emitting layer EML1, the first light emitting layer EML1 may emit light of a first color. For example, the first color may be red, and the first light emitting layer EML1 may include an organic material emitting red light.

The first light emitting layer EML1 may include a first auxiliary layer. The first auxiliary layer may enhance resonance of light emitted from the first light emitting layer EML1. For example, the first auxiliary layer may include an amine-based organic compound, and the resonance may be reinforced by adjusting the thickness of the first auxiliary layer. By way of example, the first auxiliary layer may include a metal having high reflectivity, such as Ag or MgAg, and a material for adjusting an optical path, such as $SiN_x$, $SiO_x$, $TiO_2$, $Ta_2O_5$, ITO, or IZO. These may be used alone or in combination with each other.

The second light emitting layer EML2 may be disposed on the first light emitting layer EML1 and may overlap the first, second, and third sub pixel areas SPA1, SPA2, and SPA3. For example, the second light emitting layer EML2 may be commonly disposed in the display area DA. In case that electrons and holes are injected into the second light emitting layer EML2, the second light emitting layer EML2 may emit light of a second color. For example, the second color may be green, and the second light emitting layer EML2 may include an organic material emitting green light.

The third light emitting layer EML3 may be disposed on the second light emitting layer EML2 and may overlap the third sub pixel area SPA3. In case that electrons and holes are injected into the third light emitting layer EML3, the third light emitting layer EML3 may emit light of a third color. For example, the third color may be blue, and the third light emitting layer EML3 may include an organic material emitting blue light.

The third light emitting layer EML3 may include a third auxiliary layer. The third auxiliary layer may enhance resonance of light emitted from the first light emitting layer EML1. For example, the first auxiliary layer may include an amine-based organic compound, and the resonance may be reinforced by adjusting the thickness of the third auxiliary layer. By way of example, the third auxiliary layer may include a metal having high reflectivity, such as Ag or MgAg, and a material for adjusting an optical path, such as $SiN_x$, $SiO_x$, $TiO_2$, $Ta_2O_5$, ITO, or IZO. These may be used alone or in combination with each other.

The electron transport region ETR may be disposed on the first light emitting layer EML1, the second light emitting layer EML2, and the third light emitting layer EML3, and may overlap the first, second, and third sub pixel areas SPA1, SPA2, and SPA3. For example, the electron transport region ETR may be commonly disposed in the display area DA. The electron transport region ETR may include at least one of an electron injection layer and an electron transport layer. By way of example, the electron transport region ETR may further include an electron buffer layer, a hole blocking layer, and the like within the spirit and the scope of the disclosure.

For example, a fine metal mask ("FMM") may be used twice to form the first, second, and third light emitting layers EML1, EML2, and EML3. Accordingly, the manufacturing process of the display device DD may be simplified compared to the case of individually forming a light emitting layer in each of the first, second, and third sub-pixel areas SPA1, SPA2, and SPA3.

The display device DD may have a structure in which the first color light (for example, the red light) and the second color light (for example, the green light) primarily resonate inside the first light emitting element EL1 and the second light emitting element EL2, respectively and in which the third color light (for example, the blue light) secondarily resonates inside the third light emitting element EL3.

Referring to FIG. 5, it has been described that the first light emitting layer EML1 emits red light, the second light emitting layer EML2 emits green light, and the third light emitting layer EML3 emits blue light, but the disclosure is not limited thereto. For example, each of the first, second, and third light emitting layers EML1, EML2, and EML3 may emit any one of red light, green light, and blue light.

FIGS. 6, 7, 8, 9, 10, 11, 12, and 13 are schematic cross-sectional views for a manufacturing method of the display device of FIG. 2.

Figure 6:
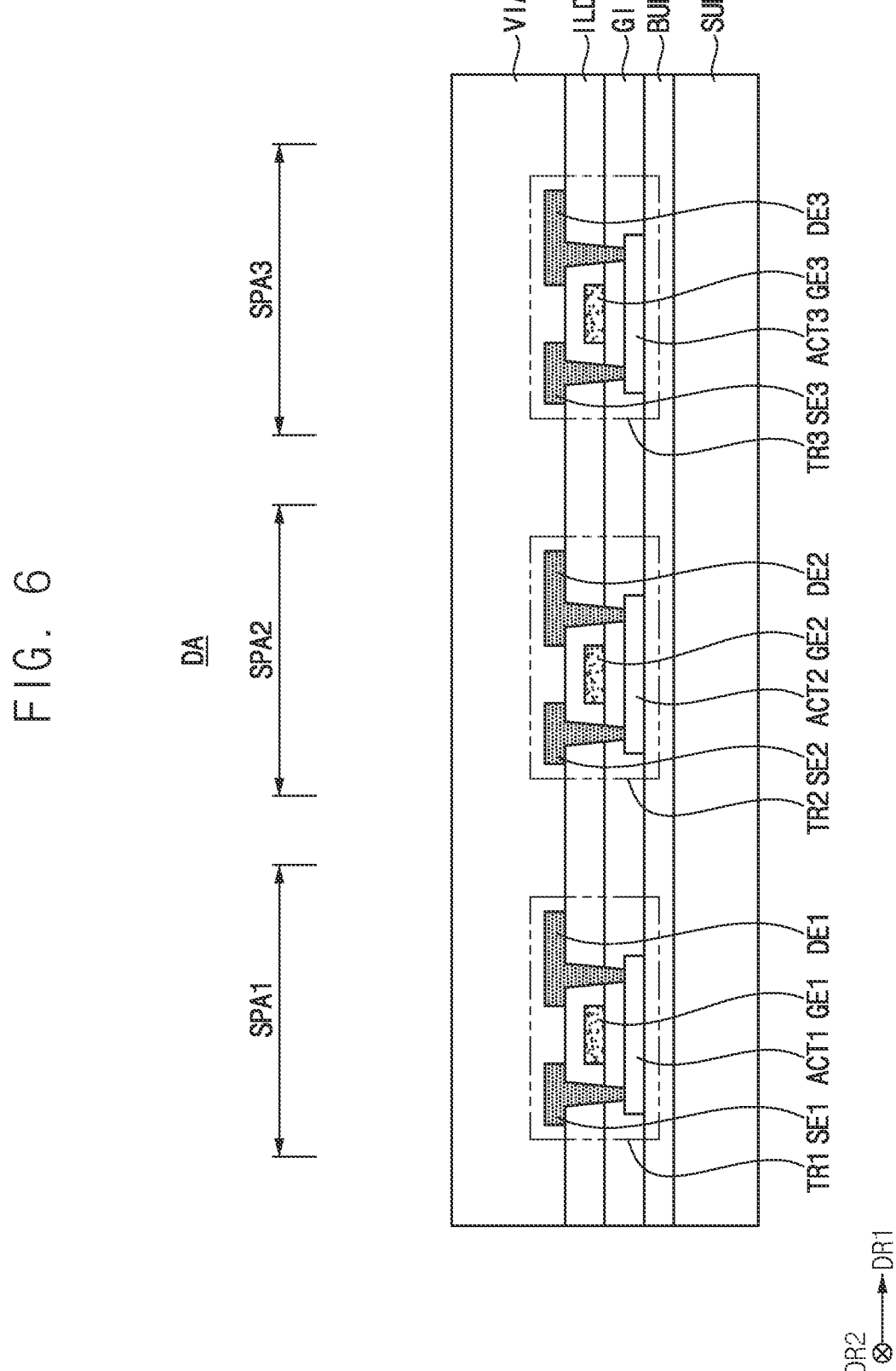

Referring to FIG. 6, the buffer layer BUF, the first, second, and third active patterns ACT1, ACT2, and ACT3, the gate insulating layer GI, the first, second, and third gate electrodes GE1, GE2, and GE3, the interlayer insulating layer ILD, the first, second, and third source electrodes SE1, SE2, and SE3, the first, second, and third drain electrodes DE1, DE2, DE3, and the via insulating layer VIA may be sequentially disposed on the substrate SUB.

Figure 8:
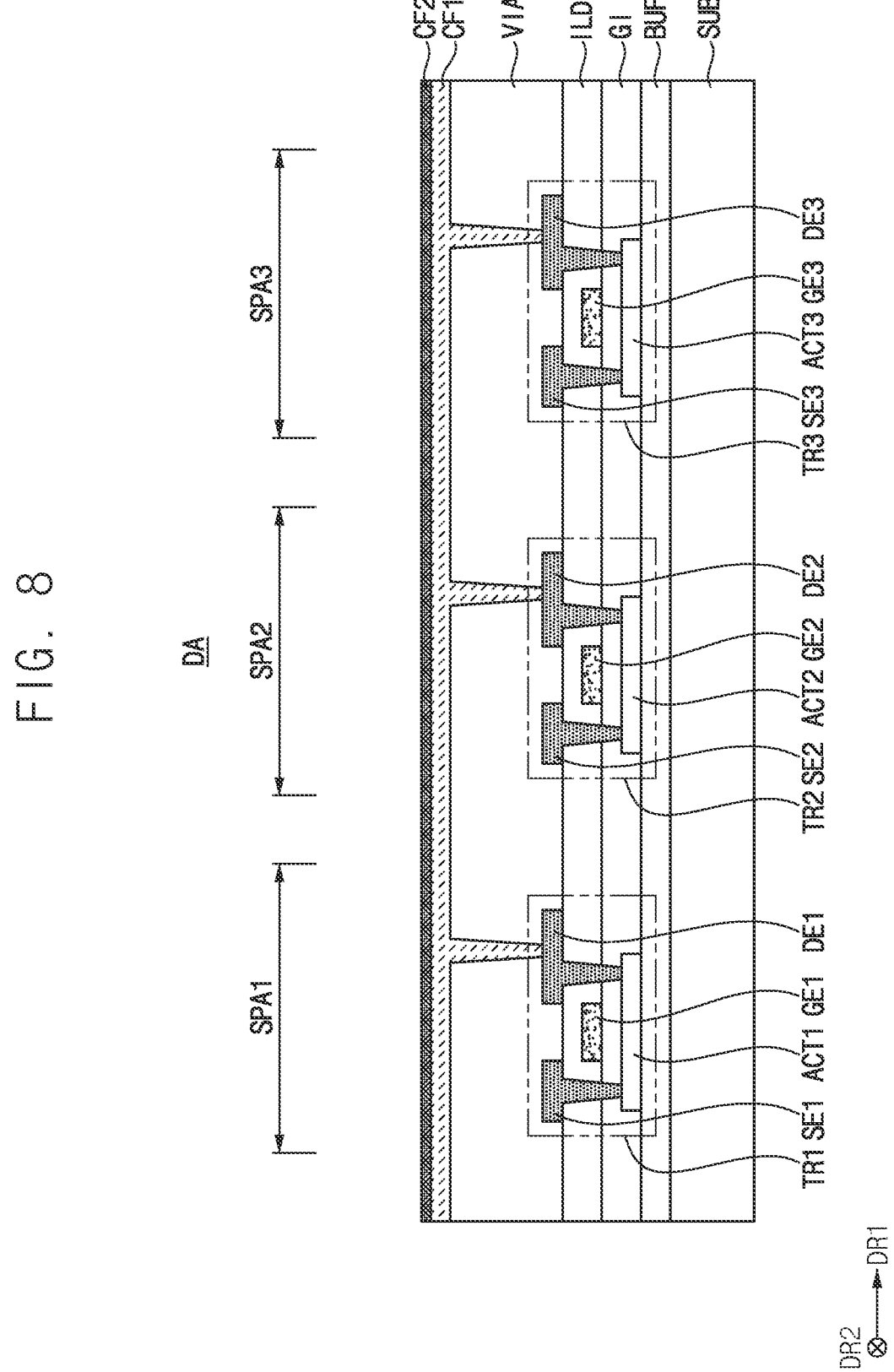

Referring to FIGS. 7 and 8, the first, second, and third contact holes CNT1, CNT2, and CNT3 may be formed by removing a portion of the via insulating layer VIA. The first, second, and third contact holes CNT1, CNT2, and CNT3 may be formed simultaneously. The first contact hole CNT1 may expose a portion of an upper surface of the first drain electrode DE1, the second contact hole CNT2 may expose a portion of an upper surface of the second drain electrode DE2, and the third contact hole CNT3 may expose a portion of an upper surface of the third drain electrode DE3.

The first conductive film CF1 and the second conductive film CF2 may be sequentially formed on the via insulating layer VIA. The first conductive film CF1 and the second conductive film CF2 may be commonly formed over the display area DA. The first conductive film CF1 may fill the first, second, and third contact holes CNT1, CNT2, and CNT3. For example, the first conductive film CF1 may be formed using aluminum, and the second conductive film CF2 may be formed using tungsten oxide.

Figure 9:
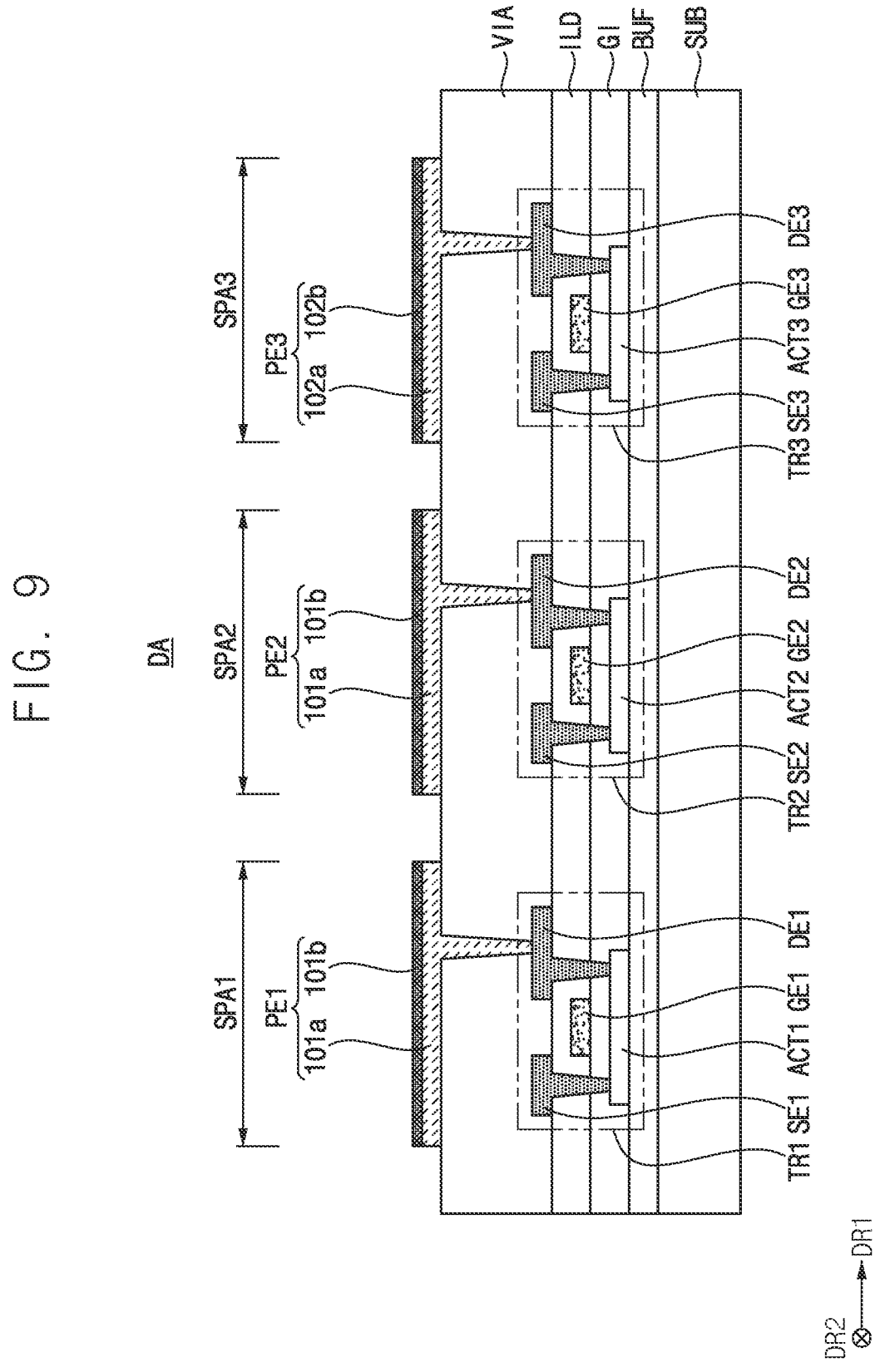

Referring to FIGS. 8 and 9, a photosensitive organic film may be formed on the via insulating layer VIA. For example, the photosensitive organic film may be formed using a photoresist. A portion of the photosensitive organic film that does not overlap the first sub-pixel area SPA1, the second sub-pixel area SPA2, and the third sub-pixel area SPA3 may be removed through an exposure process using a photo mask. Accordingly, a photosensitive organic pattern overlapping each of the first sub-pixel area SPA1, the second sub-pixel area SPA2, and the third sub-pixel area SPA3 may be formed.

The first conductive film CF1 and the second conductive film CF2 may be etched through a first etching process using the photosensitive organic pattern as a mask. In an embodiment, the first etching process may be a dry etching process.

As the first conductive film CF1 and the second conductive film CF2 are etched, the first pixel electrode PE1 including the first conductive layer 101a and the second conductive layer 101b may be formed in the first sub-pixel area SPA1 on the via insulating layer VIA. At the same time, as the first conductive film CF1 and the second conductive film CF2 are etched, the second pixel electrode PE2 includes the first conductive layer 101a and the second conductive layer 101b may be formed in the second sub-pixel area SPA2 on the via insulating layer VIA. At the same time, the third pixel electrode PE3 including the third conductive layer 102a and the fourth conductive layer 102b may be formed in the third sub-pixel area SPA3 on the via insulation layer VIA.

Figure 10:
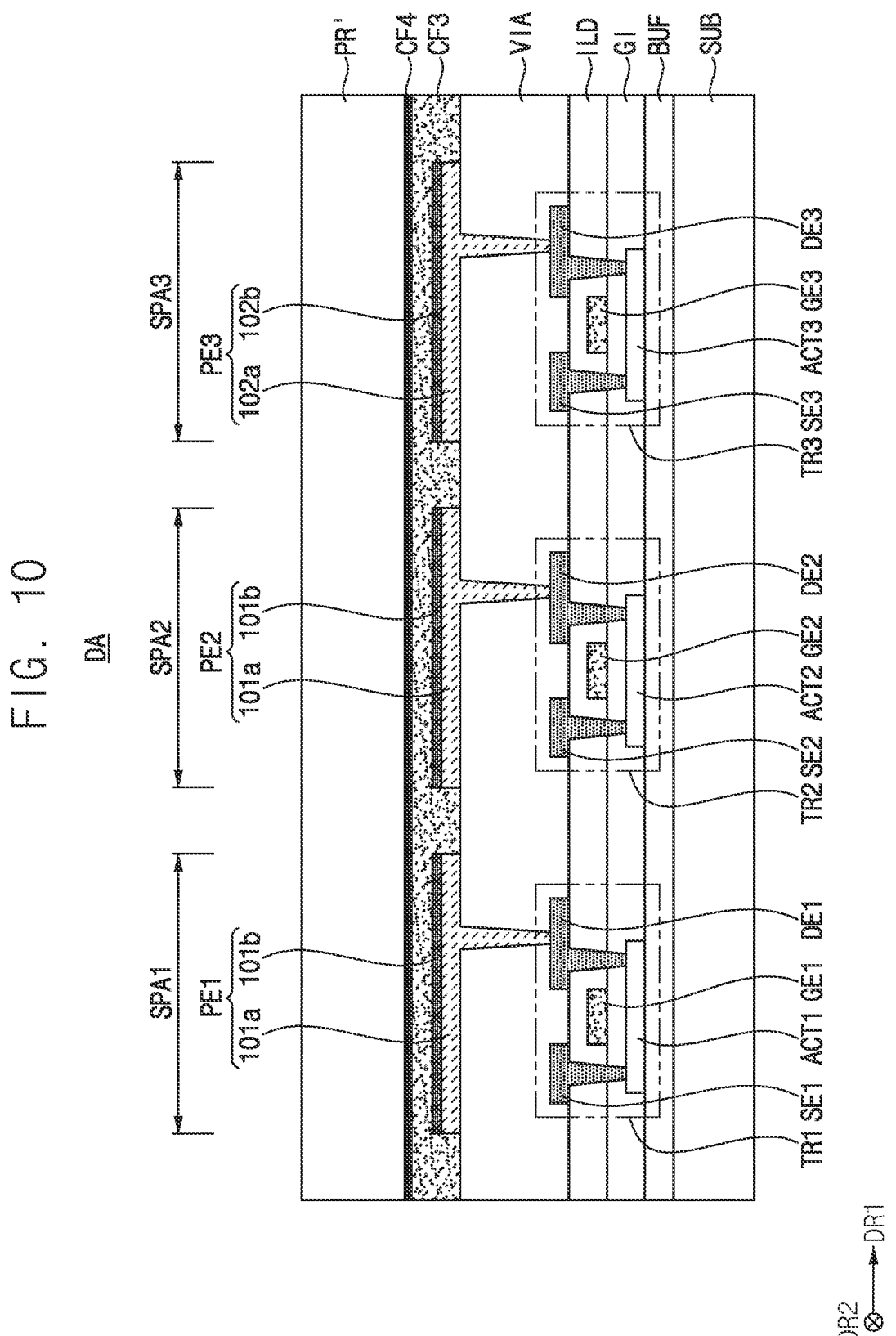

Referring to FIG. 10, a third conductive film CF3 and a fourth conductive film CF4 may be sequentially formed on the via insulating layer VIA. The third conductive film CF3 and the fourth conductive film CF4 may be commonly formed over the display area DA, and may cover the first pixel electrode PE1, the second pixel electrode PE2, the third conductive layer 102$a$, and the fourth conductive layer 102$b$. For example, the third conductive film CF3 may be formed using indium zinc oxide or indium gallium zinc oxide, and the fourth conductive film CF4 may be formed using indium tin oxide.

A photosensitive organic layer PR' may be formed on the fourth conductive film CF4. For example, the photosensitive organic layer PR' may be formed using a photoresist.

Referring to FIG. 11, a portion of the photosensitive organic layer PR' may be removed through an exposure process using a photomask. For example, all of the photosensitive organic layer PR' that does not overlap the third sub-pixel area SPA3 may be removed through the exposure process. Accordingly, through the exposure process, the photosensitive organic layer PR' overlapping the third sub-pixel area SPA3 may remain and the photosensitive organic pattern PR may be formed. For example, an upper surface of the photosensitive organic pattern PR may have a convex shape in cross section.

Referring to FIG. 12, the third conductive film CF3 and the fourth conductive film CF4 may be etched through a second etching process using the photosensitive organic pattern PR as a mask. In an embodiment, the second etching process may be a wet etching process. In an embodiment, the second etching process may be a dry etching process. The third conductive film CF3 and the fourth conductive film CF4 may have a higher etch rate with a same etchant than the first, second, and third pixel electrodes PE1, PE2, and PE3. Therefore, in the etching process for the third conductive film CF3 and the fourth conductive film CF4, the first, second, and third pixel electrodes PE1, PE2, and PE3 may not be etched.

The thickness compensation pattern TCP including the first thickness compensation layer 103$a$ and the second thickness compensation layer 103$b$ sequentially stacked each other on the fourth conductive film CF4 may be formed in the third sub-pixel area SPA3. After the thickness compensation pattern TCP is formed, the photosensitive organic pattern PR may be removed.

Figure 13:
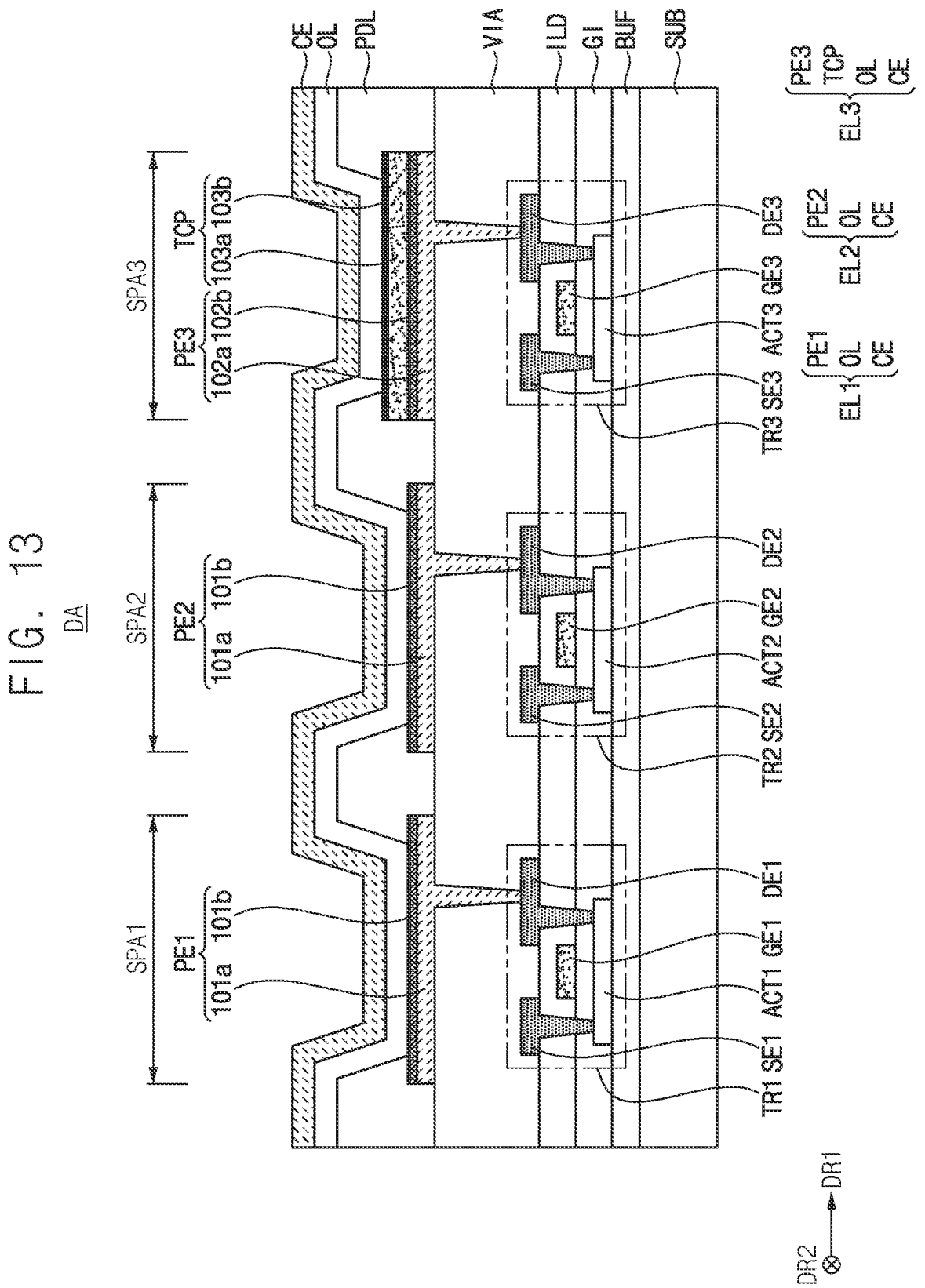

Referring to FIG. 13, the pixel defining layer PDL may be formed on the via insulating layer VIA. An opening exposing an upper surface of each of the first pixel electrode PE1, the second pixel electrode PE2, and the thickness compensation pattern TCP may be formed in the pixel defining layer PDL. For example, the pixel defining layer PDL may be formed using an organic material such as polyimide.

The organic layer OL may be formed on the first pixel electrode PE1, the second pixel electrode PE2, the thickness compensation pattern TCP, and the pixel defining layer PDL. The organic layer OL may be commonly formed over the display area DA. The common electrode CE may be formed on the organic layer OL. The common electrode CE may be commonly formed over the display area DA.

Referring back to FIG. 2, the encapsulation layer TFE may be formed on the common electrode CE. The encapsulation layer TFE may be commonly formed over the display area DA. The encapsulation layer TFE may include at least one inorganic layer and at least one organic layer.

Accordingly, the display device DD shown in FIG. 2 may be manufactured.

FIG. 14 is a view illustrating reflectance of a pixel electrode according to a wavelength band of external light incident on a pixel electrode according to comparative example and example.

A pixel electrode having a two-layer structure was manufactured through a sputtering process according to comparative examples and examples.

In a comparative example 1 (CEX1), a pixel electrode including A1 (thickness: 1000 Å)/ITO (thickness: 70 Å) was manufactured. In a comparative example 2 (CEX2), a pixel electrode including A1 (thickness: 1000 Å)/ITO (thickness: 150 Å) was manufactured. In a comparative example 3, a pixel electrode including A1 (thickness: 1000 Å)/IGZO (thickness: 150 Å) was manufactured.

In an example 1 (EX1), a pixel electrode including A1 (thickness: 1000 Å)/WO$_x$ (thickness: 150 Å) was manufactured by adding 3% oxygen in the process of depositing by a sputtering process. In an example 2 (EX2), a pixel electrode including A1 (thickness: 1000 Å)/WO$_x$ (thickness: 70 Å) was manufactured by adding 3% oxygen during deposition by a sputtering process. In an example 3 (EX3), a pixel electrode including A1 (thickness: 1000 Å)/WO$_x$ (thickness: 150 Å) was manufactured. In an example 4 (EX4), a pixel electrode including A1 (thickness: 1000 Å)/WO$_x$ (thickness: 70 Å) was manufactured. In an example 3 (EX3) and an example 4 (EX4), oxygen was not added during the deposition process by the sputtering process.

The reflectance of the pixel electrode satisfying the comparative example 1 (CEX1), the comparative example 2 (CEX2), the example 1 (EX1), the example 2 (EX2), the example 3 (EX3), and the example 4 (EX4) was measured for each wavelength band of external light. Contact resistance of the pixel electrode satisfying the comparative example 2 (CEX2), the comparative example 3, and the example 3 (EX3) was measured. In Table 1 below, the reflectance of the pixel electrode satisfying the comparative example 2 (CEX2), the comparative example 3, and the example 3 (EX3) by external light having a wavelength of about 450 nm was measured.

As a result, referring to FIG. 14 and Table 1 below, that the reflectance by external light of the pixel electrode may be substantially similar between the case where the pixel electrode includes Al/WO$_x$ and the case where the pixel electrode includes Al/ITO may be seen. For reference, reflectance in the Table 1 below indicates reflectance by external light having a wavelength of about 450 nm.

Referring to the Table 1 below, that the contact resistance of the pixel electrode including Al/WO$_x$ is smaller than the contact resistance of the pixel electrode including Al/ITO or Al/IGZO may be seen.

TABLE 1

|  | Reflectivity (%) | Contact resistance ($\Omega \cdot cm^2$) |
|---|---|---|
| Comparative example 2 | 92.8 | $10^{-2} \sim 5 \times 10^{-2}$ |
| Comparative example 3 | 92.3 | $>10$ |
| Example 3 | 89.5 | $10^{-4} \sim 3 \times 10^{-2}$ |

Figure 15:
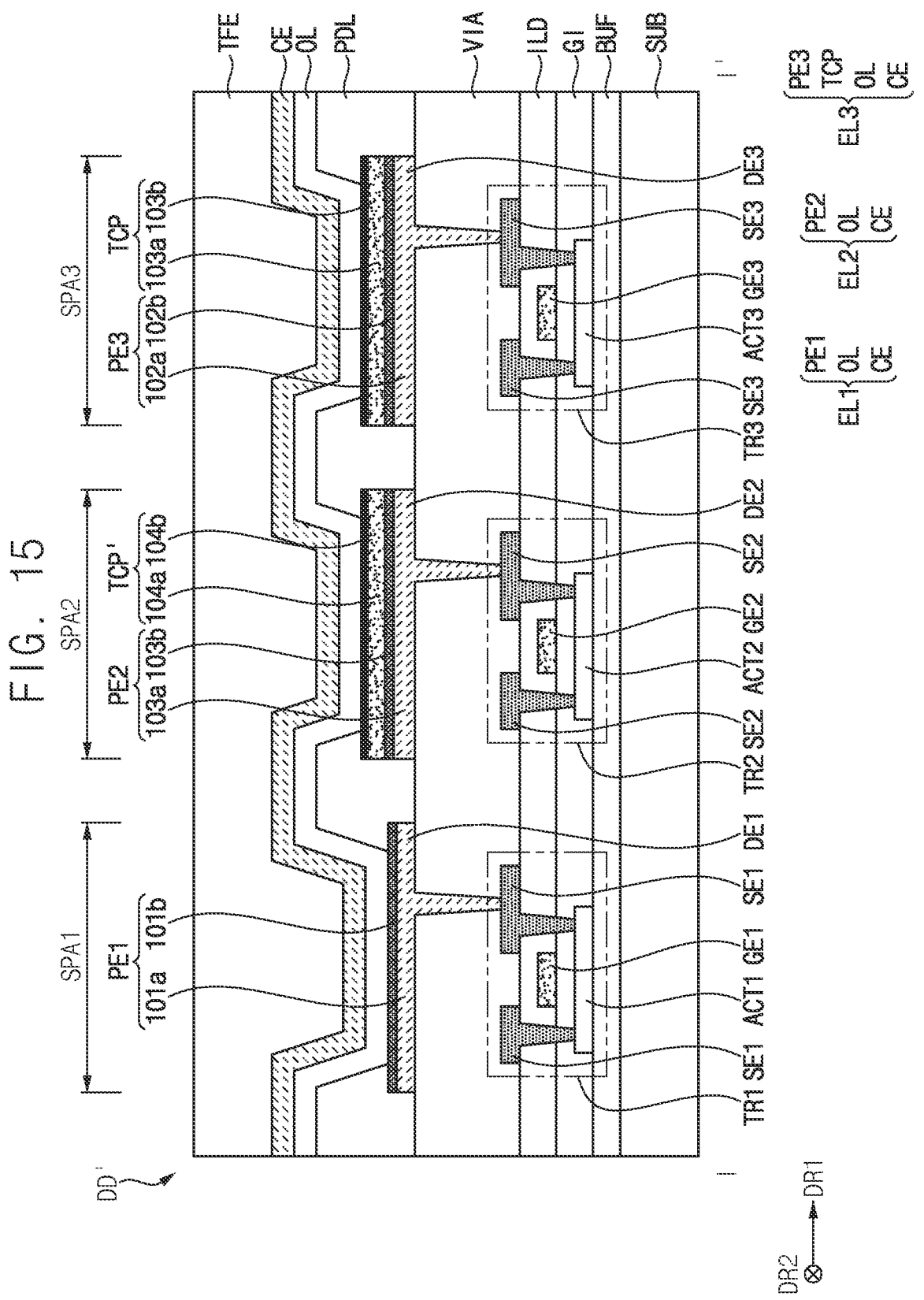
FIG. 15 is a schematic cross-sectional view illustrating a display device according to an embodiment.

FIG. 15 is a schematic cross-sectional view illustrating a display device according to an embodiment.

Referring to FIG. 15, a display device DD' according to an embodiment may include a substrate SUB, a buffer layer BUF, first, second, and third transistors TR1, TR2, and TR3, a gate insulating layer GI, an interlayer insulating layer ILD, a via insulating layer VIA, a pixel defining layer PDL, first, second, and third light emitting elements EL1, EL2, and EL3, and an encapsulation layer TFE. Hereinafter, descriptions overlapping those of the display device DD described with reference to FIGS. 2, 3, and 4 may be omitted or simplified.

The first, second, and third pixel electrodes PE1, PE2, and PE3 may be disposed on the via insulating layer VIA. For example, each of the first, second, and third pixel electrodes PE1, PE2, and PE3 may have a two-layer structure.

A thickness compensation pattern TCP including a first thickness compensation layer 103a and a second thickness compensation layer 103b sequentially stacked each other may be disposed on the third pixel electrode PE3. A thickness compensation pattern TCP' including a third thickness compensation layer 104a and a fourth thickness compensation layer 104b sequentially stacked each other on the second pixel electrode PE2 may be disposed. The third thickness compensation layer 104a may include a same material or a similar material as the first thickness compensation layer 103a, and the fourth thickness compensation layer 104b may include a same material or a similar material as the second thickness compensation layer 103b. For example, the third thickness compensation layer 104a may include indium zinc oxide or indium gallium zinc oxide, and the fourth thickness compensation layer 104b may include indium tin oxide.

However, the disclosure is not limited thereto. For example, the thickness compensation patterns TCP and TCP' may be disposed on at least one pixel electrode among the first, second, and third pixel electrodes PE1, PE2, and PE3.

Figure 16:
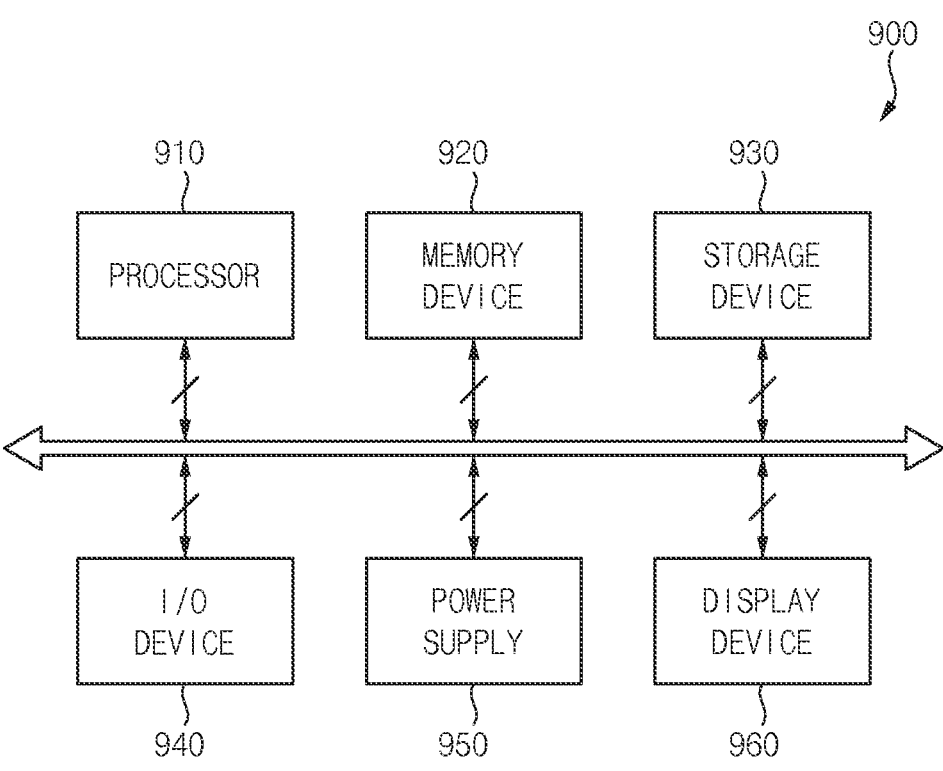
FIG. 16 is a block diagram illustrating an electronic device including the display device of FIG. 1.
Figure 17:
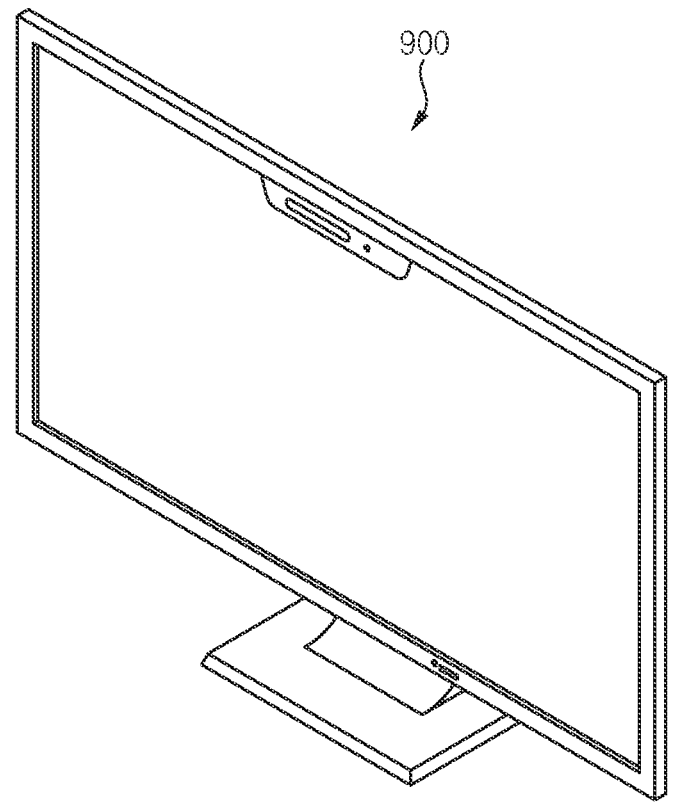
FIG. 17 is a view illustrating an example in which the electronic device of FIG. 16 is implemented as a television.
Figure 18:
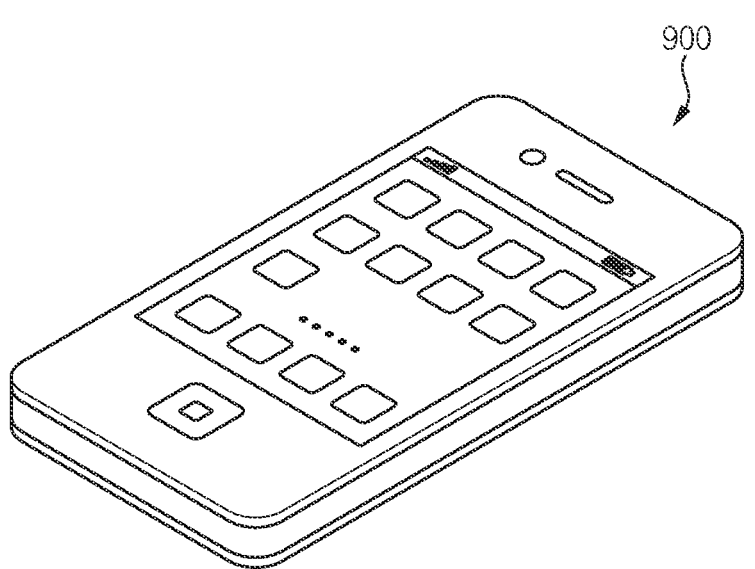
FIG. 18 is a diagram illustrating an example in which the electronic device of FIG. 16 is implemented as a smart phone.

FIG. 16 is a block diagram illustrating an electronic device including the display device of FIG. 1. FIG. 17 is a view illustrating an example in which the electronic device of FIG. 16 is implemented as a television. FIG. 18 is a diagram illustrating an example in which the electronic device of FIG. 16 is implemented as a smart phone.

Referring to FIGS. 16, 17 and 18, in an embodiment, the electronic device 900 may include a processor 910, a memory device 920, a storage device 930, an input/output ("I/O") device 940, a power supply 950 and a display device 960. The display device 960 may correspond to the display device DD described with reference to FIGS. 1, 2, 3, 4, and 5. The electronic device 900 may further include various ports capable of communicating with a video card, a sound card, a memory card, a USB device, and the like within the spirit and the scope of the disclosure.

In an embodiment, as illustrated in FIG. 17, the electronic device 900 may be implemented as a television. In an embodiment, as illustrated in FIG. 18, the electronic device 900 may be implemented as a smart phone. However, embodiments are not limited thereto, in an embodiment, the electronic device 900 may be implemented as a cellular phone, a video phone, a smart pad, a smart watch, a tablet personal computer ("PC"), a car navigation system, a computer monitor, a laptop, a head disposed (for example, mounted) display ("HMD"), or the like within the spirit and the scope of the disclosure.

The processor 910 may perform various computing functions. In an embodiment, the processor 910 may be a microprocessor, a central processing unit ("CPU"), an application processor ("AP"), or the like within the spirit and the scope of the disclosure. The processor 910 may be coupled to or connected to other components via an address bus, a control bus, a data bus, or the like within the spirit and the scope of the disclosure. The processor 910 may be coupled to or connected to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like within the spirit and the scope of the disclosure.

The storage device 930 may include a solid state drive ("SSD") device, a hard disk drive ("HDD") device, a CD-ROM device, or the like within the spirit and the scope of the disclosure.

The I/O device 940 may include an input device such as a keyboard, a keypad, a mouse device, a touchpad, a touch-screen, or the like, and an output device such as a printer, a speaker, or the like within the spirit and the scope of the disclosure.

The power supply 950 may provide power for operations of the electronic device 900. The display device 960 may be coupled to or connected to other components via the buses or other communication links. In an embodiment, the display device 960 may be included in the I/O device 940.

The disclosure can be applied to various display devices. For example, the disclosure is applicable to various display devices such as display devices for vehicles, ships and aircraft, portable communication devices, display devices for exhibition or information transmission, medical display devices, and the like within the spirit and the scope of the disclosure.

The foregoing is illustrative of embodiments and is not to be construed as limiting thereof. Although embodiments have been described, those skilled in the art will readily appreciate that many modifications are possible in the embodiments without materially departing from the novel teachings and advantages of the disclosure. Accordingly, all such modifications are intended to be included within the scope of the disclosure and as defined in the claims. Therefore, it is to be understood that the foregoing is illustrative of various embodiments and is not to be construed as limited to the embodiments disclosed, and that modifications to the disclosed embodiments, as well as other embodiments, are intended to be included within the scope of the appended claims.

What is claimed is:

1. A display device comprising:

a first sub-pixel area that emits a first light and a second sub-pixel area that emits a second light different from the first light;

a first pixel electrode disposed in the first sub-pixel area on a substrate and including a first conductive layer including a metal material and a second conductive layer including tungsten oxide;

a second pixel electrode disposed in the second sub-pixel area on the substrate and including:

a third conductive layer, the third conductive layer and the first conductive layer including a same material; and a fourth conductive layer, the fourth conductive layer and the second conductive layer including a same material;

a thickness compensation pattern disposed on the second pixel electrode and including a sequentially stacked first thickness compensation layer including a first transparent conductive oxide and a sequentially stacked second thickness compensation layer including a second transparent conductive oxide, wherein the first transparent conductive oxide includes at least one selected from a group consisting of indium zinc oxide and indium gallium zinc oxide, and the second transparent conductive oxide includes indium tin oxide;

a first light emitting layer disposed on the first pixel electrode; and a second light emitting layer disposed on the thickness compensation pattern, wherein the thickness compensation pattern has an etching rate higher than an etching rate of the first pixel electrode or the second pixel electrode with respect to a same etchant.

2. The display device of claim 1, wherein the tungsten oxide included in the second conductive layer further includes tantalum.

3. The display device of claim 1, wherein the metal material includes aluminum.

4. The display device of claim 1, wherein
a thickness of the first conductive layer is substantially equal to a thickness of the third conductive layer, and
a thickness of the second conductive layer is substantially equal to a thickness of the fourth conductive layer.

5. The display device of claim 4, wherein a thickness of the first conductive layer is greater than a thickness of the second conductive layer and a thickness of the third conductive layer is greater than a thickness of the fourth conductive layer.

6. The display device of claim 4, wherein a thickness of the first transparent conductive oxide is less than a thickness of the third conductive layer.

7. The display device of claim 4, wherein each of a thickness of the second conductive layer and a thickness of the fourth conductive layer is greater than a thickness of the second transparent conductive oxide.

8. The display device of claim 1, wherein the substrate includes a third sub-pixel area that emits a third light different from the first light of the first sub-pixel area and the second light of the second sub-pixel area.

9. The display device of claim 8, further comprising:
a third pixel electrode disposed in the third sub-pixel area; and
a third light emitting layer disposed on the third pixel electrode, wherein
the first light emitting layer overlaps the first sub-pixel area in a plan view,
the second light emitting layer overlaps the second sub-pixel area in the plan view, and
the third light emitting layer overlaps the first sub-pixel area, the second sub-pixel area, and the third sub-pixel area in the plan view.

10. The display device of claim 8, further comprising:
a third pixel electrode disposed in the third sub-pixel area, the third pixel electrode and the first pixel electrode having a same structure.

11. The display device of claim 8, further comprising:
a third pixel electrode disposed in the third sub-pixel area, the third pixel electrode and the second pixel electrode having a same structure; and
a first thickness compensation pattern disposed on the third pixel electrode, the first thickness compensation pattern and the thickness compensation pattern having a same structure.

12. A method of manufacturing a display device, the method comprising:

sequentially forming a first conductive film including a metal material and a second conductive film including tungsten oxide on a substrate including a first sub-pixel area that emits a first light and a second sub-pixel area that emits a second light different from the first light;

forming a first conductive layer and a second conductive layer sequentially stacked in the first sub-pixel area and a third conductive layer and a fourth conductive layer sequentially stacked in the second sub-pixel area by etching the first conductive film and the second conductive film through dry etching;

sequentially forming a third conductive film including a first transparent conductive oxide and a fourth conductive film including a second transparent conductive oxide on the substrate, the first conductive layer and the second conductive layer in the first sub-pixel area, and the third conductive layer, and the fourth conductive layer in the second sub-pixel area, wherein the first transparent conductive oxide includes at least one selected from a group consisting of indium zinc oxide and indium gallium zinc oxide, and the second transparent conductive oxide includes indium tin oxide;

forming a thickness compensation pattern comprising a first thickness compensation layer and a second thickness compensation layer sequentially stacked on the fourth conductive layer by etching the third conductive film and the fourth conductive film to remove the third conductive film and the fourth conductive film from the first sub-pixel area;

forming a first light emitting layer on the second conductive layer; and forming a second light emitting layer on the fourth conductive layer, wherein the thickness compensation pattern has an etching rate higher than an etching rate of the first conductive layer or the second conductive layer with respect to a same etchant.

13. The method of claim 12, wherein the forming of the first thickness compensation layer and the second thickness compensation layer includes:
forming a photosensitive organic layer on the third conductive layer and the fourth conductive layer;
forming a photosensitive organic pattern overlapping the second sub-pixel area in a plan view by exposing the photosensitive organic layer;
removing portions of the third conductive film and the fourth conductive film using the photosensitive organic pattern as a mask; and
removing the photosensitive organic pattern.

14. The method of claim 13, wherein an upper surface of the photosensitive organic pattern has a substantially convex shape in cross-section.

15. The method of claim 13, wherein in the removing of portions of the third conductive film and the fourth conductive film,
the first thickness compensation layer and the second thickness compensation layer are formed by remaining the third conductive film and the fourth conductive film overlapping the second sub-pixel area in the plan view.

16. The method of claim 12, wherein the forming of the first thickness compensation layer and the second thickness compensation layer is performed through wet etching or dry etching.

17. The method of claim 12, wherein the metal material includes aluminum.

18. The method of claim 12, wherein a thickness of the third conductive layer is greater than a thickness of the fourth conductive layer, a thickness of the first thickness compensation layer is less than a thickness of the third conductive layer, and the thickness of the fourth conductive layer is greater than a thickness of the second thickness compensation layer.

19. An electronic device comprising:

a display device; and a power supply which that provides power the display device;

wherein the display device includes:

a first sub-pixel area that emits a first light and a second sub-pixel area that emits a second light different from the first light;

a first pixel electrode disposed in the first sub-pixel area on a substrate and including a first conductive layer including a metal material and a second conductive layer including tungsten oxide;

a second pixel electrode disposed in the second sub-pixel area on the substrate and including:

a third conductive layer, the third conductive layer and the first conductive layer including a same material; and a fourth conductive layer, the fourth conductive layer and the second conductive layer including a same material;

a thickness compensation pattern disposed on the second pixel electrode and including a sequentially stacked first thickness compensation layer including a first transparent conductive oxide and a sequentially stacked second thickness compensation layer including a second transparent conductive oxide, wherein the first transparent conductive oxide includes at least one selected from a group consisting of indium zinc oxide and indium gallium zinc oxide, and the second transparent conductive oxide includes indium tin oxide;

a first light emitting layer disposed on the first pixel electrode; and a second light emitting layer disposed on the thickness compensation pattern, and wherein the thickness compensation pattern has an etching rate higher than an etching rate of the first pixel electrode or the second pixel electrode with respect to a same etchant.

* * * * *